United States Patent
Chien

(10) Patent No.: US 7,196,559 B2
(45) Date of Patent: Mar. 27, 2007

(54) MULTI-MODULUS DIVIDER FOR HIGH SPEED APPLICATIONS

(75) Inventor: Hung-Ming Chien, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 150 days.

(21) Appl. No.: 11/084,945

(22) Filed: Mar. 21, 2005

(65) Prior Publication Data

US 2006/0208807 A1    Sep. 21, 2006

(51) Int. Cl.
*H03K 21/00* (2006.01)
(52) U.S. Cl. .......................................... 327/115; 377/47
(58) Field of Classification Search ...................... None
See application file for complete search history.

(56) References Cited

U.S. PATENT DOCUMENTS 4,575,867 A * 3/1986 Hogue ......................... 377/110

* cited by examiner

*Primary Examiner*—Joseph Chang
(74) *Attorney, Agent, or Firm*—McAndrews, Held & Malloy, Ltd.

(57) ABSTRACT

A multi-modulus divider for high speed applications is provided and may comprise a multistage divider generating a divided signal from an output portion of a divider module for a current stage. The divided signal may be fed back to an input portion of the divider module in the current stage via a reduced feedback delay path. If the input portion of the divider module in the current stage is coupled to the divider module in a previous stage, a first load signal may be communicated from the divider module in the current stage to the divider module in the previous stage. If the divider module in the current stage is coupled to the divider module in the previous stage, the method may further comprise receiving the divided signal from the divider module in the previous stage.

18 Claims, 15 Drawing Sheets

| State | MC | LD_IN | Present Q0 Q1 | D0 D1 | Next Q0 Q1 | LD_OUT |
|---|---|---|---|---|---|---|
| 0000 | 0 | 0 | 00 | 11 | 11 | 0 |
| 0001 | 0 | 0 | 01 | 11 | 11 | 0 |
| 0010 | 0 | 0 | 10 | 11 | 11 | 0 |
| 0011 | 0 | 0 | 11 | 10 | 10 | 0 |
| 0100 | 0 | 1 | 00 | 11 | 11 | 1 |
| 0101 | 0 | 1 | 01 | 11 | 11 | 0 |
| 0110 | 0 | 1 | 10 | 11 | 11 | 1 |
| 0111 | 0 | 1 | 11 | 10 | 10 | 0 |
| 1000 | 1 | 0 | 00 | 11 | 11 | 0 |
| 1001 | 1 | 0 | 01 | 11 | 11 | 0 |
| 1010 | 1 | 0 | 10 | 11 | 11 | 0 |
| 1011 | 1 | 0 | 11 | 10 | 10 | 0 |
| 1100 | 1 | 1 | 00 | 01 | 01 | 1 |
| 1101 | 1 | 1 | 01 | 11 | 11 | 0 |
| 1110 | 1 | 1 | 10 | 01 | 01 | 1 |
| 1111 | 1 | 1 | 11 | 10 | 10 | 0 |

MULTI-MODULUS DIVIDER FOR HIGH SPEED APPLICATIONS

CROSS-REFERENCE TO RELATED APPLICATIONS/INCORPORATION BY REFERENCE

Not Applicable.

FIELD OF THE INVENTION

Certain embodiments of the invention relate to a divider circuit. More specifically, certain embodiments of the invention relate to a multi-modulus divider for high speed applications.

BACKGROUND OF THE INVENTION

In some conventional communications systems, a frequency divider may be utilized to downconvert a signal to a lower frequency. In one application, for example, a frequency divider may be part of a phase-locked loop (PLL), which generates an output signal of a desired frequency utilizing a voltage controlled oscillator (VCO). The VCO may generate a signal whose frequency depends on a control voltage generated by a phase detector. The phase detector may generate the control voltage by comparing a reference signal to a feedback portion of the VCO output signal. In this manner, the VCO output signal may be kept from drifting to a different frequency value.

The reference signal, however, may have a lower frequency than the VCO output signal, since if the reference signal were the same frequency or a higher frequency as the desired VCO output signal, there would be no need for the PLL. The PLL may use a frequency divider so that the VCO output signal frequency is a multiple of the reference signal frequency. To make the PLL more versatile, a processor may control the frequency divider to allow it to divide the VCO output signal by different values. This may effectively allow the VCO to output signals whose frequencies may be various multiples of the reference signal.

Therefore, the PLL may be utilized by various transmitters and receivers that need to be able to transmit or receive a plurality of frequencies. Some devices which may need to do this may be, for example, AM and FM radios, television sets, walkie-talkies, cordless phones, and wireless phones, whether for cellular or personal communication service (PCS) system. However, as the carrier frequency increases, the circuitry that handles the radio frequency (RF) signals must be adapted to handle the higher frequencies. With wireless systems, for example, the PCS system, the RF carrier may have a frequency of a gigahertz or more. One problem with existing frequency divider circuits is that they have to operate over a wide range of carrier frequencies. As a result, a different frequency divider circuit has to be utilized for applications operating at different frequencies. For devices operating over a wider frequency range, a plurality of frequency dividers are required and this significantly increases system cost.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A multi-modulus divider for high speed applications, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 5a is an exemplary state table illustrating states of the divider module logic of FIG. 3, in accordance with an embodiment of the invention.

DETAILED DESCRIPTION OF THE INVENTION

Figure 1:
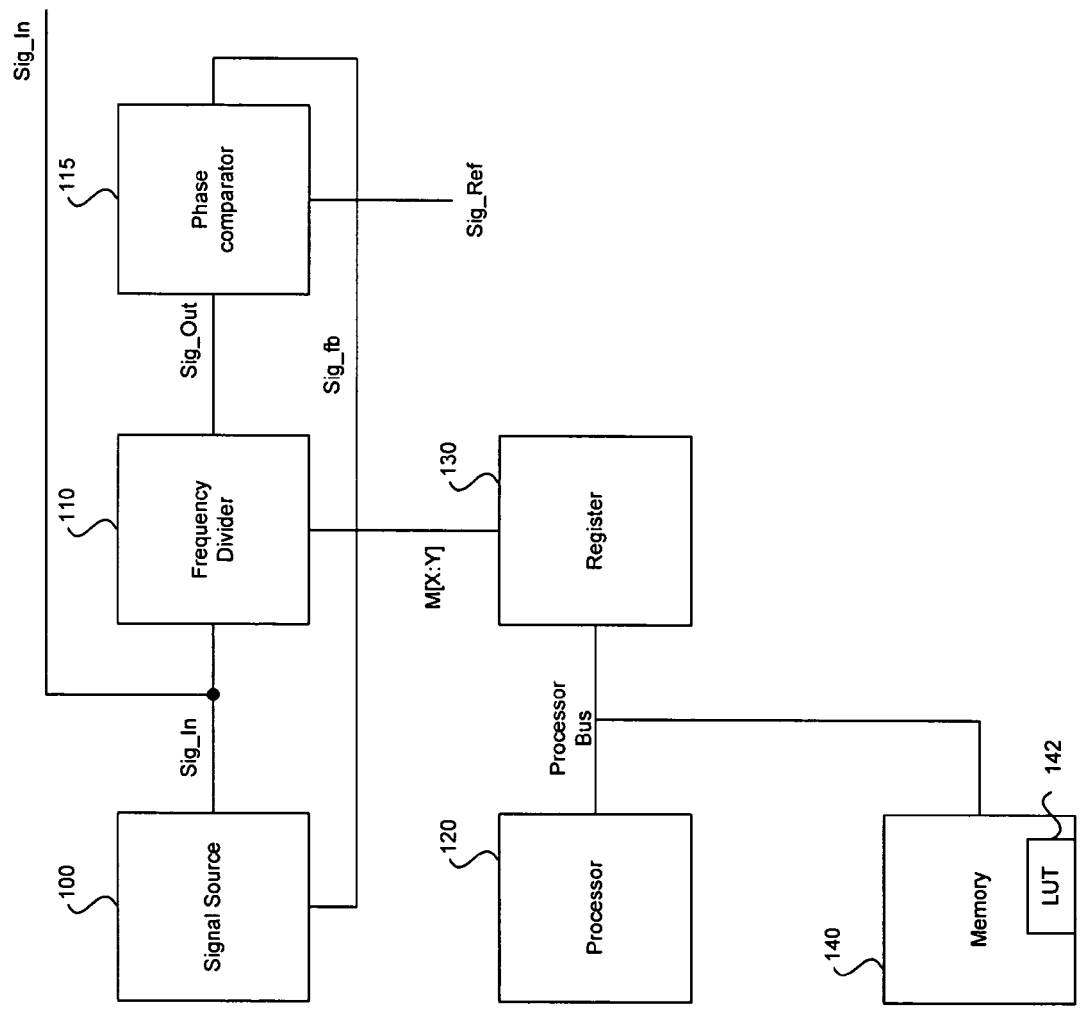
FIG. 1 is a block diagram illustrating exemplary circuitry for frequency division of a signal, in accordance with an embodiment of the invention.

Certain embodiments of the invention may be found in a multi-modulus divider for high speed applications. Various aspects of the invention may be utilized for reducing the frequency of an input signal by an integer divide factor, where the integer value may be within a range of values. The range of integer values may be implementation dependent. Aspects of the invention may comprise reducing delay through a critical path. For signals at high frequencies, for example, frequencies on the order of gigahertz (GHz), what may on the surface seem like a small additional delay, for example, 1 nanosecond (nS) delay, may adversely affect operation of a circuitry that may handle those signals. For a signal having a frequency of one GHz, the period of one cycle is 1 nS. In order to reduce the frequency of the input signal by an integer divide factor, an accurate count of each cycle of the input signal may be kept. Occasionally missing a cycle due to propagation delay may yield unpredictable and/or unwanted results.

Aspects of the invention may comprise generating a divided signal from an output portion of a divider module for a current stage. The divided signal may be fed back to an input portion of the divider module in the current stage via a reduced feedback delay path. If the input portion of the divider module in the current stage is coupled to the divider module in a previous stage, a first load signal may be communicated from the divider module in the current stage to the divider module in the previous stage. If the divider module in the current stage is coupled to the divider module in the previous stage, the divided signal may be received from the divider module in the previous stage.

If the divider module in the current stage is coupled to the divider module in a subsequent stage, the divided signal may be communicated to the divider module in the subsequent stage. A received second load signal may be utilized to generate the first load signal for the current stage. If the divider module in the current stage is not coupled to the divider module in the subsequent stage, an input port of the divider module that receives the second load signal may be coupled to a high voltage potential of a voltage supply. The high voltage potential may indicate logic one.

The divided signal may be generated by utilizing divide cycles to divide the input signal. The divide cycle of dividing by a factor of two may be utilized to divide by a factor of two continuously. Alternatively, the divide cycle may comprise dividing by a factor of three once and then subsequently by a factor of two. The received second load signal may be used to initiate a new divide cycle. A received control input signal may indicate how the divider module should divide the input signal. The method may couple N stages of the divider modules in the multistage divider, and the input signal to the multistage divider may be divided by any integer from $2^N$ to $((2^{N+1})-1)$, inclusive.

The FIGS. 1–7 described below may refer to and/or illustrate input signals and/or output signals utilized in digital logic circuitry and/or in timing diagrams. Accordingly, each signal may have one of two digital values, logic one or logic zero, which may change from one digital value to the other at various times. For example, a signal that may have a digital value of logic one may change to a digital value of logic zero, and vice versa. Alternatively, some signals may have one digital value without changing to the other digital value. For example, a signal may remain at logic one or logic zero.

FIG. 1 is a block diagram illustrating exemplary circuitry for frequency division of a signal, in accordance with an embodiment of the invention. Referring to FIG. 1, there is shown a signal source 100, a frequency divider 110, a phase comparator 115, a processor 120, a register 130, and a memory block 140. A look-up table (LUT) 142 may be implemented in the memory block 140.

The signal source 100 may comprise suitable logic and/or circuitry that may be adapted to generate a signal of a fixed and/or variable frequency. For example, the signal source 100 may be an oscillator with a fixed frequency output. Alternatively, the signal source 100 may be a voltage-controlled oscillator that may generate an output whose frequency may be controlled by an input control voltage. The signal source 100 may generate an output signal, which may be referred to as Sig_In.

The frequency divider 110 may comprise suitable logic and/or circuitry that may be adapted to reduce the frequency of an input signal, for example, the signal source 100 output signal, Sig_In, by an integer divide factor. The output of the frequency divider 110 may be referred to as Sig_Out. The integer divide factor that may be utilized for generating the output signal, Sig_Out, may be communicated to the frequency divider 110 by a device, for example, a register 130, which may store a value written by a processor, for example, the processor 120. The integer divide factor communicated to the frequency divider 110 may be an encoded value that may be utilized by the frequency divider 110 to reduce the frequency of the input signal, Sig_In, by the appropriate integer divide factor.

The phase comparator 115 may comprise suitable logic and/or circuitry that may be adapted to compare two signals, for example, the signal, Sig_Out, and a reference signal, for example, Sig_Ref, and generate an output signal, for example, Sig_fb. The signal, Sig_fb, may indicate whether the signal, Sig_Out, leads or lags in phase with respect to the reference signal, Sig_Ref. The signal, Sig_fb, may be fed back to an oscillator, for example, the signal source 100, which may be a VCO. The signal source 100 may then adjust the frequency of the output signal, Sig_In, as indicated by the feedback signal, Sig_fb.

The processor 120 may comprise suitable logic, circuitry, and/or code that may be adapted to control operation of the frequency divider 110. The processor 120 may determine the frequency of the desired output signal, Sig_Out, and calculate the integer value that may be utilized in reducing the frequency of the input signal, Sig_In. Alternatively, the processor 120 may look up the integer value in, for example, the LUT 142. The processor 120 may communicate a value to the register 130 that may indicate the integer divide factor by which to reduce the frequency of the input signal, Sig_In, to generate the output signal, Sig_Out. An example of notation for the value communicated may be M[X:Y], where X may indicate a bit position of the least significant bit and Y may indicate the bit position of the most significant bit. For example, M[0:6] may indicate that the value communicated to the frequency divider 110 may comprise 7 bits, with the least significant bit at bit position 0 and the most significant bit at bit position 6.

The register 130 may comprise suitable logic, circuitry, and/or code that may be adapted to store data. The data stored may be written by a processor, for example, the processor 120, via a processor bus. The register 130 may be coupled to the frequency divider 110 such that the value stored in the register 130 may be communicated to the frequency divider 110.

The memory block 140 may comprise suitable logic, circuitry, and/or code that may be adapted to store data and to retrieve the stored data. A device, for example, the processor 120, may write data to the memory block 140 to be stored, and then may retrieve the data later. The memory block 140 may be one or more of a plurality of types of memory, for example, static random access memory or dynamic random access memory.

The LUT 142 may comprise suitable logic, circuitry, and/or code that may be adapted to store data and to retrieve the stored data. For example, the LUT 142 may be part of the memory block 140. A processor, for example, the processor 120, may generate relationships where accessing one value may give a related value. For example, looking up a temperature in Fahrenheit scale in a temperature look-up table may result an equivalent temperature in Celsius scale. Another example of a look-up table may be relating a desired radio frequency (RF) to an integer divide factor. The integer divide factor may be utilized by the frequency divider 110 to generate a signal of the desired frequency. The desired frequency may be, for example, the frequency of the reference signal, Sig_Ref. Looking up a RF frequency may result in retrieving an integer divide factor that may then be stored in the register 130.

In operation, the signal source 100, which may be, for example, a VCO, may generate a signal, Sig_In, which may have a specific frequency. This signal, Sig_In, may be communicated to the frequency divider 110. The processor 120 may determine the frequency of the signal, Sig_In, needed for an application, for example, to use as a local intermediate frequency (IF) signal to mix with a RF signal. The mixing of the local IF signal and the RF signal may result in a desired output IF signal whose frequency may be the difference between the RF signal frequency and the IF signal frequency.

The frequency divider 110 may divide the signal, Sig_In, by an appropriate integer divide factor so that the divided signal, Sig_Out, may be the same frequency as the reference signal, Sig_Ref. Therefore, the signal, Sig_In, may also be communicated to the phase comparator 115. The phase comparator 115 may generate an output signal, Sig_fb, that may indicate whether the signal, Sig_In, may lead or lag in phase with respect to the reference signal, Sig_fb. The output signal, Sig_fb, may be fed back to the signal source 100, which may utilize the fed back output signal, Sig_fb, to adjust the frequency of the signal, Sig_In. When the frequency of the signal, Sig_In, is the desired frequency, the divided signal, Sig_Out, may be the same frequency as the reference signal, Sig_Ref.

At a later time, a processor, for example, the processor 120, may determine the need for a different communication channel, which may be transmitting at a different frequency. This may require a local IF signal, for example, Sig_In, at a different frequency than the previous local IF signal frequency in order to keep the output IF signal frequency constant. The processor 120 may determine a new value that may be utilized by the frequency divider 110 to generate the new local IF signal. The new value may be written to the register 130 by the processor 120, and the register 120 may communicate the new value to the frequency divider 110. The resulting output signal, Sig_Out, may have a different frequency than the reference signal, Sig_Ref, since the frequency divider 120 may be dividing by a new value. Therefore, the phase comparator 115 may generate an output signal, Sig_fb, that may indicate to the signal source 100 to adjust the frequency of the output signal, Sig_In. When the output signal, Sig_In, is the frequency desired for the new communication channel, the divided signal, Sig_Out, may be the same frequency as the reference signal, Sig_Ref. The output of the phase comparator 115, Sig_fb, may then indicate no change need be made to the frequency of the signal, Sig_In, generated by the signal source 100.

Figure 2A:
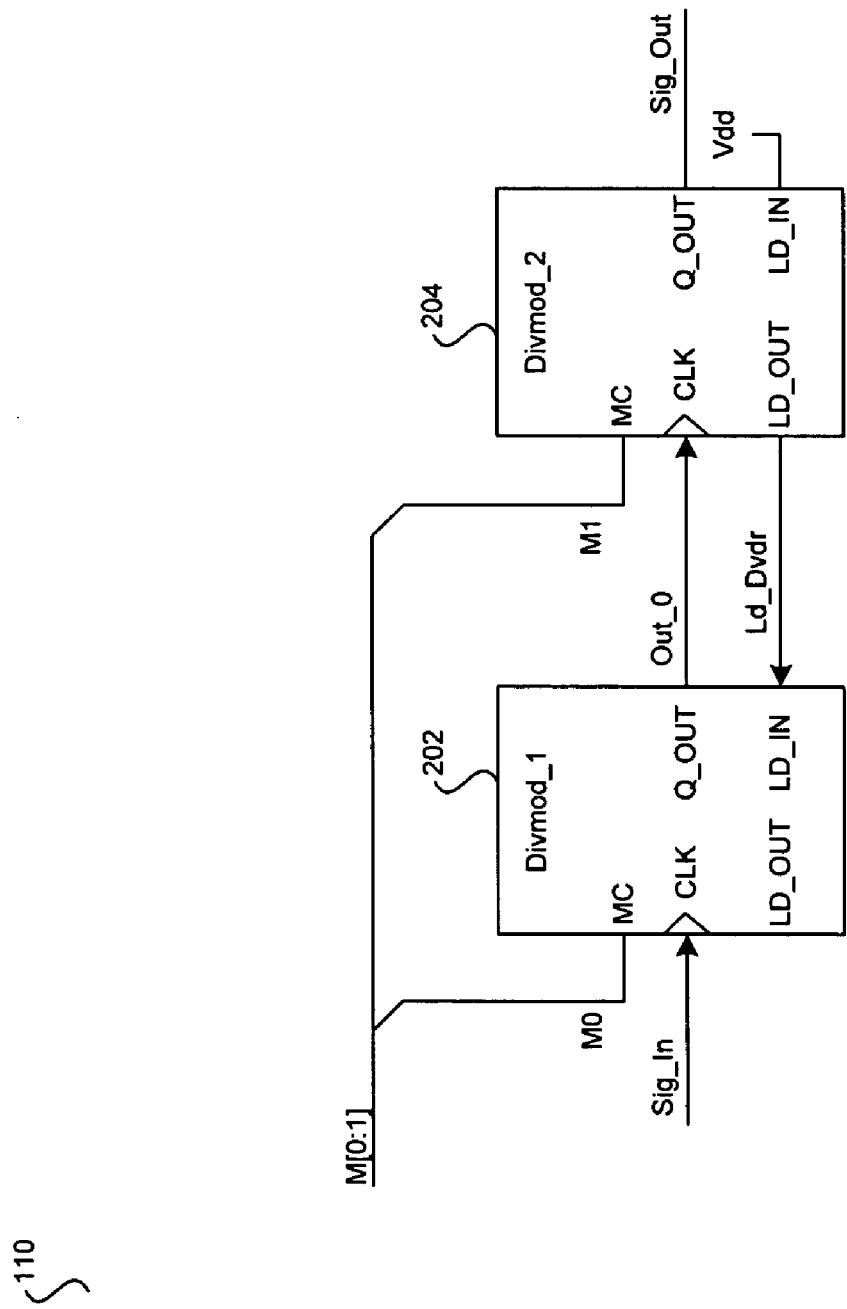
FIG. 2a is a block diagram illustrating an exemplary frequency divider with two divider modules, in accordance with an embodiment of the invention.

FIG. 2*a* is a block diagram illustrating an exemplary frequency divider with two divider modules, in accordance with an embodiment of the invention. Referring to FIG. 2*a*, there is shown a frequency divider 110 that may comprise divider modules 202 and 204. The divider modules 202 and 204 may comprise suitable logic and/or circuitry that may be adapted to divide a frequency of an input signal to generate an output signal whose frequency may be lower than the input signal frequency by an integer divide factor.

Each divider module 202 and 204 may receive input signals via the inputs MC, CLK, and LD_IN, and generate output signals that may be communicated via the outputs Q_OUT and LD_OUT. The divider module 202 may receive an input signal, for example, Sig_In. The reduction in frequency of the input signal, Sig_In, may depend on the signals at the MC and the LD_IN inputs. The divider module 202 and/or 204 may divide by two continuously, divide by three once and then subsequently by two continuously, or divide by three continuously. The functionality of a divider module and its dependence on the input signals at the LD_IN and MC inputs will be described with reference to FIGS. 2*b*–*e* and FIG. 5*a*.

The signal at the output Q_OUT may be an appropriately divided signal that may be the final output or that may be communicated to the CLK input of a subsequent stage divider module to be further divided. The load signal at the LD_OUT output may be communicated to the LD_IN input of a previous stage divider module. Accordingly, the divider module 202 may communicate the divided signal at the output Q_OUT, for example, Out_0, to the CLK input of the subsequent stage divider module 204. The divider module 204 may communicate the generated load signal, Ld_Dvdr, to the input LD_IN of the previous stage divider module 202.

In operation, a processor, for example, the processor 120 (FIG. 1), may write the values that may correspond to the values of the control input signals, or control input bits, M0 and M1, to a register, for example, the register 130. The register 130 may communicate the value via control input signals M0 and M1 to the MC inputs of the divider modules 202 and 204, respectively. The LD_IN input of the divider module 204 may be coupled to a voltage source, for example, Vdd, which may be logic one. The LD_OUT output of the divider module 204 may be coupled to the LD_IN input of the divider module 202. The input signal, Sig_In, may be communicated to the CLK input of the divider module 202. The Q_OUT output of the divider module 202 may be coupled to the CLK input of the divider module 204. The output signal, Sig_Out, may have a frequency that may be appropriately divided from the frequency of the input signal, Sig_In.

An implementation of a n-stage frequency divider may be able to divide an input signal by an integer that may range from $2^n$ to $((2^{N+1})-1)$, inclusive. For example, in FIG. 2*a*, the frequency divider 110 may be a two stage frequency divider since there are two divider modules. Once an integer divide factor is determined, the control input signals M[0:n−1] to the MC inputs of the divider modules may be calculated using the following equation:

integer divide factor=$2^n+M(n-1)*(2^{n-1})+M(n-2)*(2^{n-2})+ \ldots +(M1)*(2^1)+M0$, where M(n−1) may be the control input signal for the last stage divider module and M0 may be the control input signal for the first stage divider module. The first stage divider module, for example, the divider module 202, may receive the input signal whose frequency is to be reduced. The last stage divider module, for example, the divider module 204, may output the signal whose frequency has been divided by the integer divide factor.

As an example, the frequency divider 110 in FIG. 2a, may be a two stage frequency divider, and the integer divide factor equation may be:

integer divide factor=$2^2$+(M1)*2+M0.

Therefore, the two stage frequency divider may divide by a factor that may range from four to seven. To divide by a factor of four, both M1 and M0 may be zero. To divide by a factor of five, M1 may be zero and M0 may be one. To divide by a factor of six, M1 may be one and M0 may be zero. To divide by a factor of seven, both M1 and M0 may be one.

The divider module 202 and the divider module 204 may be the same type, for example, Divmod_1, or they may be different types, for example, Divmod_1 and Divmod_2, respectively. The divider module types Divmod_1 and Divmod_2 will be described in more detail in FIGS. 3 and 4, respectively. The divider module type Divmod_1 is adapted to handle an input signal that may have frequencies higher than an input signal that divider module type Divmod_2 may be able to handle. For example, the divider module type Divmod_1 may comprise circuitry that may reduce feedback path propagation delay with respect to divider module type Divmod_2. Therefore, a frequency divider 110 may comprise divider modules of type Divmod_1, as long as the divider module type Divmod_1 is adapted to handle the frequency of the input signal to the frequency divider 110. Similarly, a frequency divider 110 may comprise divider module type Divmod_2, as long as the divider module type Divmod_2 is adapted to handle the frequency of the input signal to the frequency divider 110. Alternatively, the first divider module that may receive the input signal to the frequency divider 110 may be the divider module type Divmod_1, and each of the remaining divider modules may be either divider module type Divmod_1 or divider module type Divmod_2.

Figure 2B:
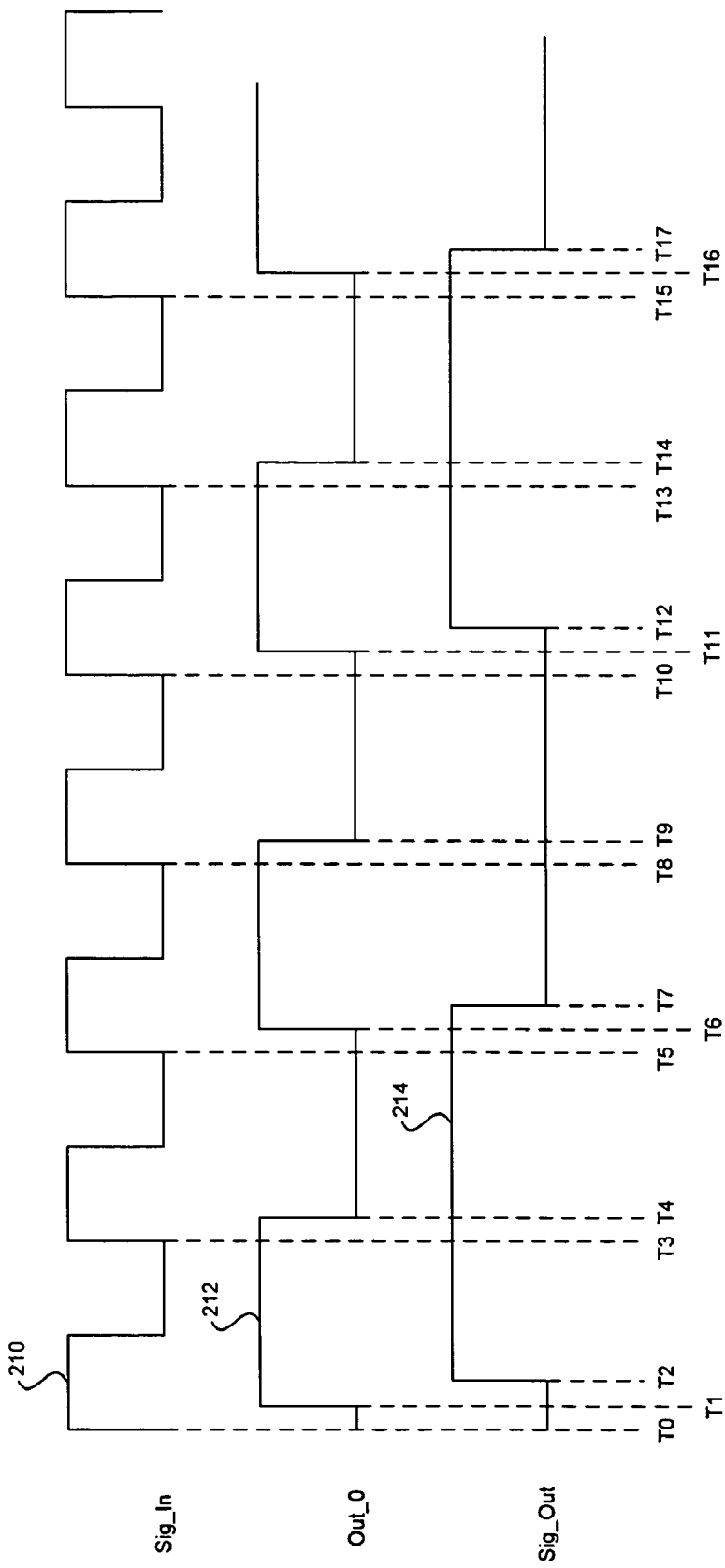
FIG. 2b is a timing diagram of exemplary signals utilized during frequency division by four by the frequency divider of FIG. 2a, in accordance with an embodiment of the invention.

FIG. 2b is a timing diagram of exemplary signals utilized during frequency division by four by the frequency divider of FIG. 2a, in accordance with an embodiment of the invention. Referring to FIG. 2b, there is shown an input signal, Sig_In 210, a signal, Out_0 212, generated by the divider module 202 (FIG. 2a), and an output signal, Sig_Out 214, generated by the divider module 204 (FIG. 2a).

In operation, the control input signals M0 and M1 to the MC inputs of the divider modules 202 and 204, respectively, may both be logic zero in order to have each divider module 202 and 204 divide by two continuously. The divider modules 202 and 204 may utilize the rising edges of the input signal, Sig_In 210, to generate the signal, Out_0 212, and the rising edges of the signal, Out_0 212, to generate the output signal, Sig_Out 214, respectively. The input signal, Sig_In 210, may be received by the CLK input of the divider module 202.

The rising edges of the input signal, Sig_In 210, at times T0, T5, T10, and T15 may lead the respective rising edges at times T1, T6, T11, and T16 of the signal, Out_0 212, which may be generated by the divider module 202. The rising edges of the Sig_In 210 at times T3, T8, and T13 may lead the respective falling edges of the signal, Out_0 212, at times T4, T9, and T14. In this case, the signal, Out_0 212, has a frequency that is one-half the frequency of the input signal, Sig_In 210. The signal, Sig_Out 212, may be communicated to the CLK input of the divider module 204. The rising edges at times T1 and T11 of the signal, Out_0 212, may lead the respective rising edges at times T2 and T12 of the output signal, Sig_Out 214. The rising edges at times T6 and T16 of the signal, Out_0 212, may lead the respective falling edges at times T7 and T17 of the output signal, Sig_Out 214. Therefore, the output signal, Sig_Out 214, may have a frequency that is one-half the frequency of the signal, Out_0 212, and one-fourth the frequency of the input signal, Sig_In 210.

Figure 2C:
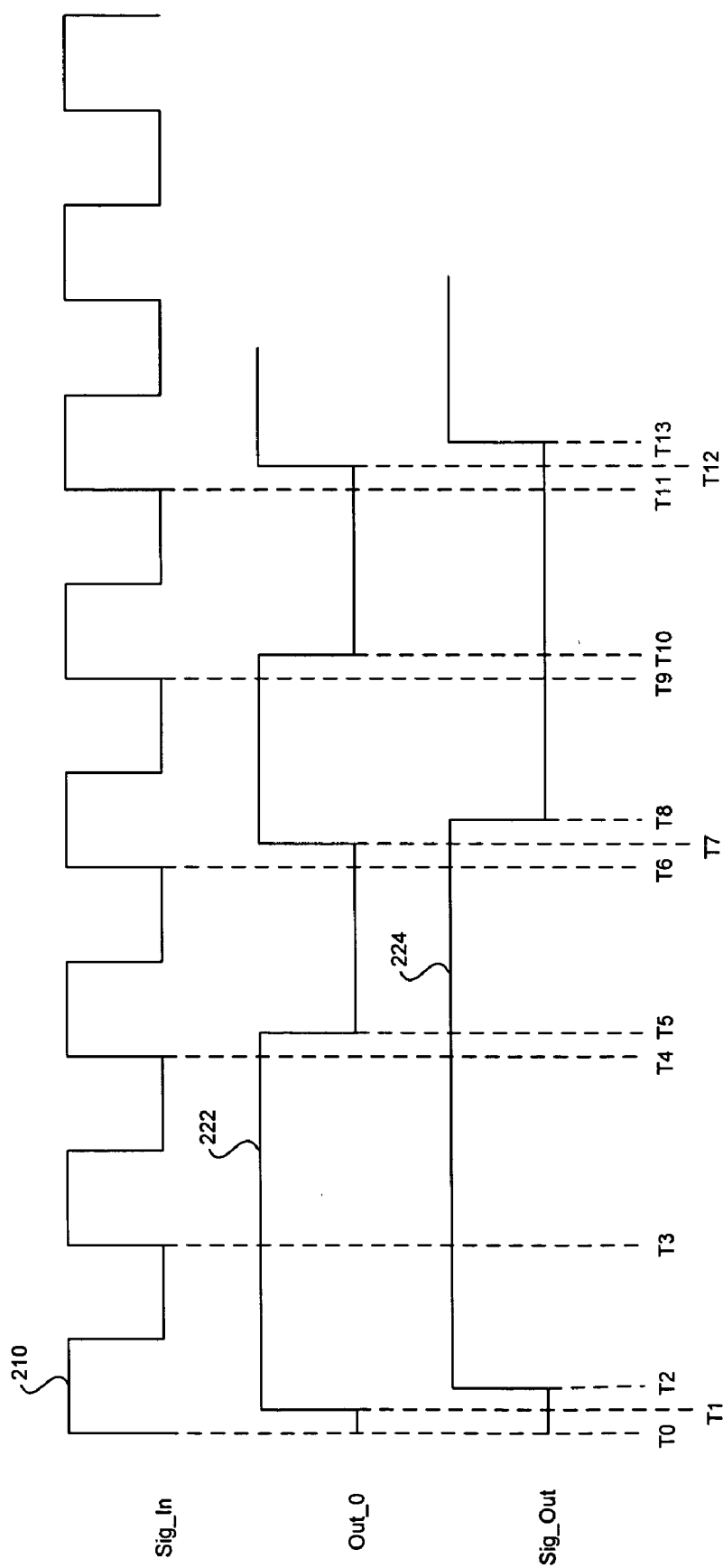
FIG. 2c is a timing diagram of exemplary signals utilized during frequency division by five by the frequency divider of FIG. 2a, in accordance with an embodiment of the invention.

FIG. 2c is a timing diagram of exemplary signals utilized during frequency division by five by the frequency division circuit of FIG. 2a, in accordance with an embodiment of the invention. Referring to FIG. 2c, there is shown an input signal, Sig_In 210, a signal, Out_0 222, generated by a first divider module 202 (FIG. 2a), and an output signal, Sig_Out 224, of a second divider module 204 (FIG. 2a).

In operation, the control input signals M0 and M1 to the MC inputs of the divider modules 202 and 204, respectively, may be logic one and logic zero, respectively. This may allow the divider module 202 to divide once by three and subsequently by two, and the divider module 204 to divide by two continuously. The divider modules 202 and 204 may utilize the rising edges of the input signal, Sig_In 210, to generate the signal, Out_0 222, and the rising edges of the signal, Out_0 222, to generate the output signal, Sig_Out 224, respectively. The input signal, Sig_In 210, may be received by the CLK input of the divider module 202.

The rising edges of the input signal, Sig_In 210, at times T0, T6, and T11 may lead the respective rising edges at times T1, T7, and T12 of the signal, Out_0 222, generated by the divider module 202. The rising edges of the input signal, Sig_In 210, at times T4 and T9 may lead the respective falling edges of the signal, Out_0 222, at times T5 and T10. The rising edge at time T3 of the input signal, Sig_In 210, may not correspond to a rising or a falling edge of the signal, Out_0 222, since the divider module 202 may be dividing by three at this time. The signal, Out_0 222, may have a frequency that is two-fifths the frequency of the input signal, Sig_In 210. The signal, Out_0 222, may be communicated to the CLK input of the divider module 204. The rising edges at times T1 and T12 of the signal, Out_0 222, may lead the respective rising edges at times T2 and T13 of the output signal, Sig_Out 224. The rising edge at time T7 of the signal, Out_0 222, may lead to the falling edge at time T8 of the output signal, Sig_Out 224. Therefore, the output signal, Sig_Out 224, may have a frequency that is one-half the frequency of the signal, Out_0 222, and one-fifth the frequency of the input signal, Sig_In 210.

Figure 2D:
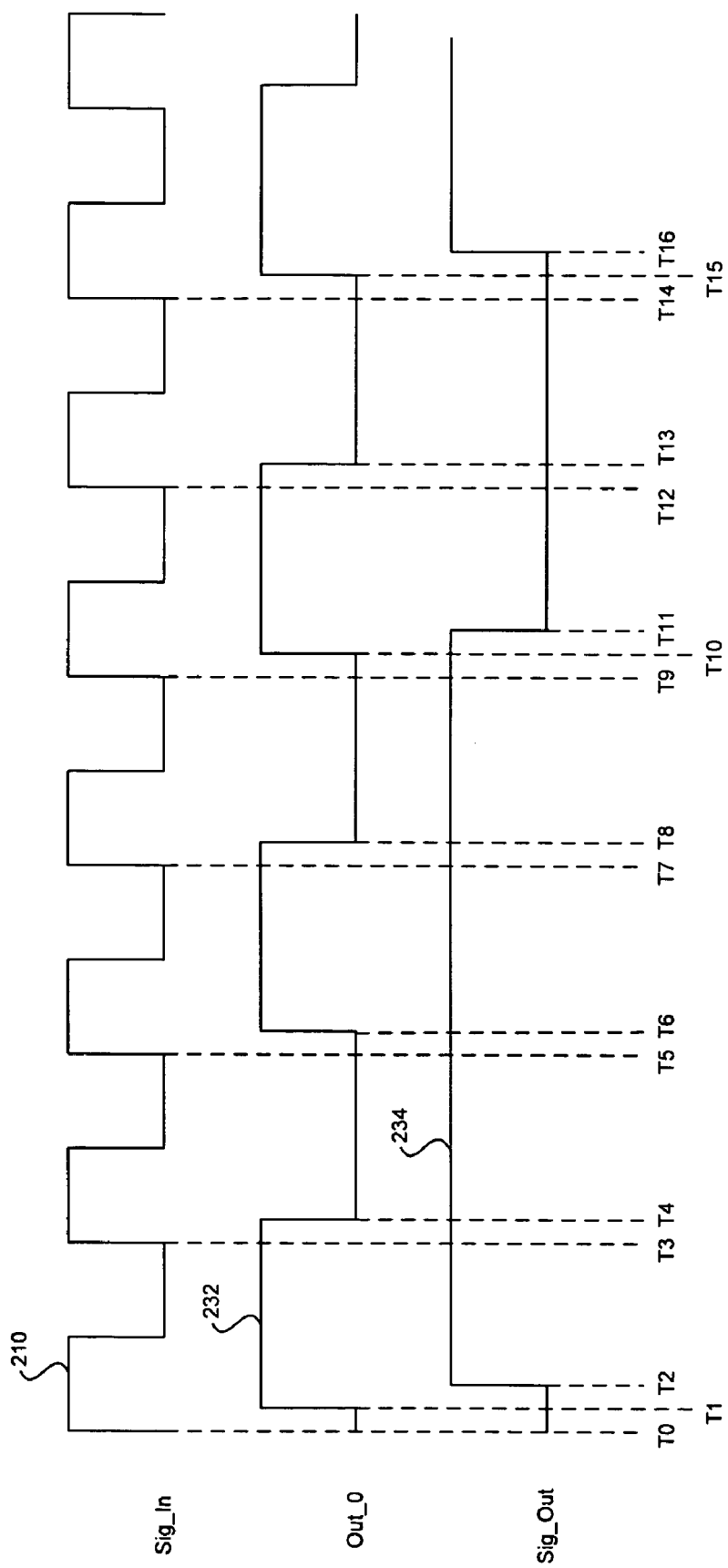
FIG. 2d is a timing diagram of exemplary signals utilized during frequency division by six by the frequency divider of FIG. 2a, in accordance with an embodiment of the invention.

FIG. 2d is a timing diagram of exemplary signals utilized during frequency division by six by the frequency division circuit of FIG. 2a, in accordance with an embodiment of the invention. Referring to FIG. 2d, there is shown an input signal, Sig_In 210, a signal, Out_0 232, generated by a first divider module 202 (FIG. 2a), and an output signal, Sig_Out 234, of a second divider module 204 (FIG. 2a).

In operation, the control input signals M0 and M1 to the MC inputs of the divider modules 202 and 204, respectively, may be logic zero and logic one, respectively. This may allow the divider module 202 to divide by two continuously, and the divider module 204 to divide once by three and subsequently by two. However, since the divider module 204 may couple the LD_IN input to Vdd, as described with respect to FIG. 2a, the divider module 204 may divide by three continuously. The divider modules 202 and 204 may utilize the rising edges of the input signal, Sig_In 210, to generate the signal, Out_0 232, and the rising edges of the signal, Out_0 232, to generate the output signal, Sig_Out 234, respectively. The input signal, Sig_In 210, may be received by the CLK input of the divider module 202.

The rising edges of the input signal, Sig_In 210, at times T0, T5, T9, and T14 may lead the respective rising edges at times T1, T6, T10, and T15 of the signal, Out_0 232, generated by the divider module 202. The rising edges of the input signal, Sig_In 210, at times T3, T7, and T12 may lead the respective falling edges of the signal, Out_0 232, at times T4, T8, and T13. The signal, Out_0 232, may have a frequency that is one-half the frequency of the input signal, Sig_In 210. The signal, Out_0 232, may be communicated to the CLK input of the divider module 204. The rising edges at times T1 and T15 of the signal, Out_0 232, may lead the respective rising edges at times T2 and T16 of the output signal, Sig_Out 234. The rising edge at time T10 of the signal, Out_0 232, may lead the respective falling edge at time T11 of the output signal, Sig_Out 234. The rising edge at time T6 of the signal, Out_0 232, may not correspond to a rising or a falling edge of the output signal, Sig_Out 234, since the divider module 204 may be dividing by three. Therefore, the output signal, Sig_Out 234, may have a frequency that is one-third the frequency of the signal, Out_0 232, and one-sixth the frequency of the input signal, Sig_In 210.

Figure 2E:
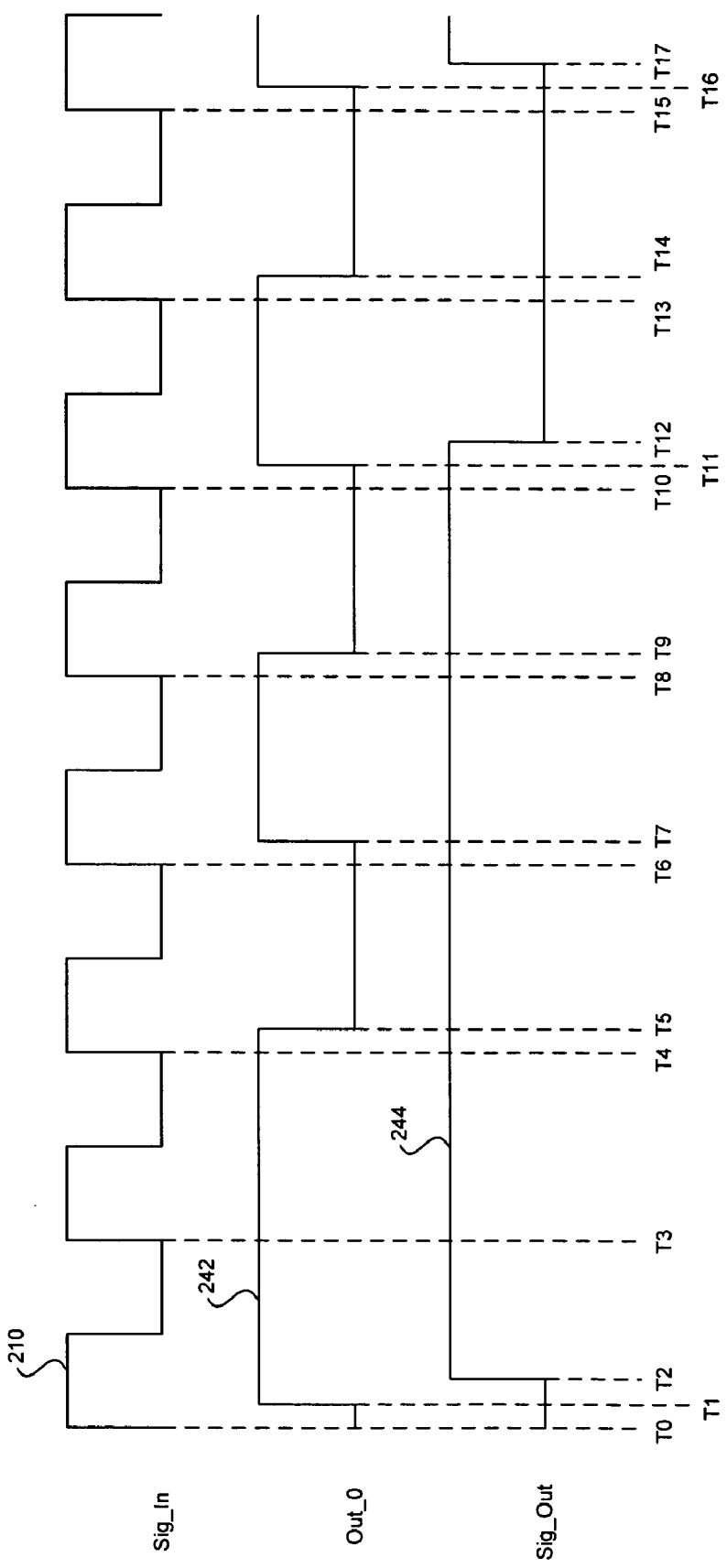
FIG. 2e is a timing diagram of exemplary signals utilized during frequency division by seven by the frequency divider of FIG. 2a, in accordance with an embodiment of the invention.

FIG. 2e is a timing diagram of exemplary signals utilized during frequency division by seven by the frequency division circuit of FIG. 2a, in accordance with an embodiment of the invention. Referring to FIG. 2e, there is shown an input signal, Sig_In 210, a signal, Out_0 242, generated by a first divider module 202 (FIG. 2a), and an output signal, Sig_Out 244, of a second divider module 204 (FIG. 2a).

In operation, the control input signals M0 and M1 to the MC inputs of the divider modules 202 and 204, respectively, may each be logic one. This may allow the divider modules 202 and 204 to divide once by three and subsequently by two. However, since the divider module 204 may couple the LD_IN input to Vdd, as described with respect to FIG. 2a, the divider module 204 may divide by three continuously. The divider modules 202 and 204 may utilize the rising edges of the input signal, Sig_In 210, to generate the signal, Out_0 242, and the rising edges of the signal, Out_0 242, to generate the output signal, Sig_Out 244, respectively. The input signal, Sig_In 210, may be received by the CLK input of the divider module 202.

The rising edges of the input signal, Sig_In 210, at times T0, T6, T10, and T15 may lead the respective rising edges at times T1, T7, T11, and T16 of the signal, Out_0 242, generated by the divider module 202. The rising edges of the input signal, Sig_In 210, at times T4, T8, and T13 may lead the respective falling edges of the signal, Out_0 242, at times T5, T9, and T14. The rising edge at time T3 of the input signal, Sig_In 210, may not correspond to a rising or a falling edge of the signal, Out_0 242, since the divider module 204 may be dividing by three at this time. The signal, Out_0 242, may have a frequency that is three-seventh the frequency of the input signal, Sig_In 210. The signal, Out_0 242, may be communicated to the CLK input of the divider module 204. The rising edges at times T1 and T16 of the signal, Out_0 242, may lead the respective rising edges at times T2 and T17 of the output signal, Sig_Out 244. The rising edge at time T11 of the signal, Out_0 242, may lead the respective falling edge at time T12 of the output signal, Sig_Out 244. The rising edge at time T7 of the signal, Out_0 242, may not correspond to a rising or a falling edge of the output signal, Sig_Out 244, since the divider module 204 may be dividing by three. Therefore, the output signal, Sig_Out 244, may have a frequency that is one-third the frequency of the signal, Out_0 242, and one-seventh the frequency of the input signal, Sig_In 210.

Figure 3:
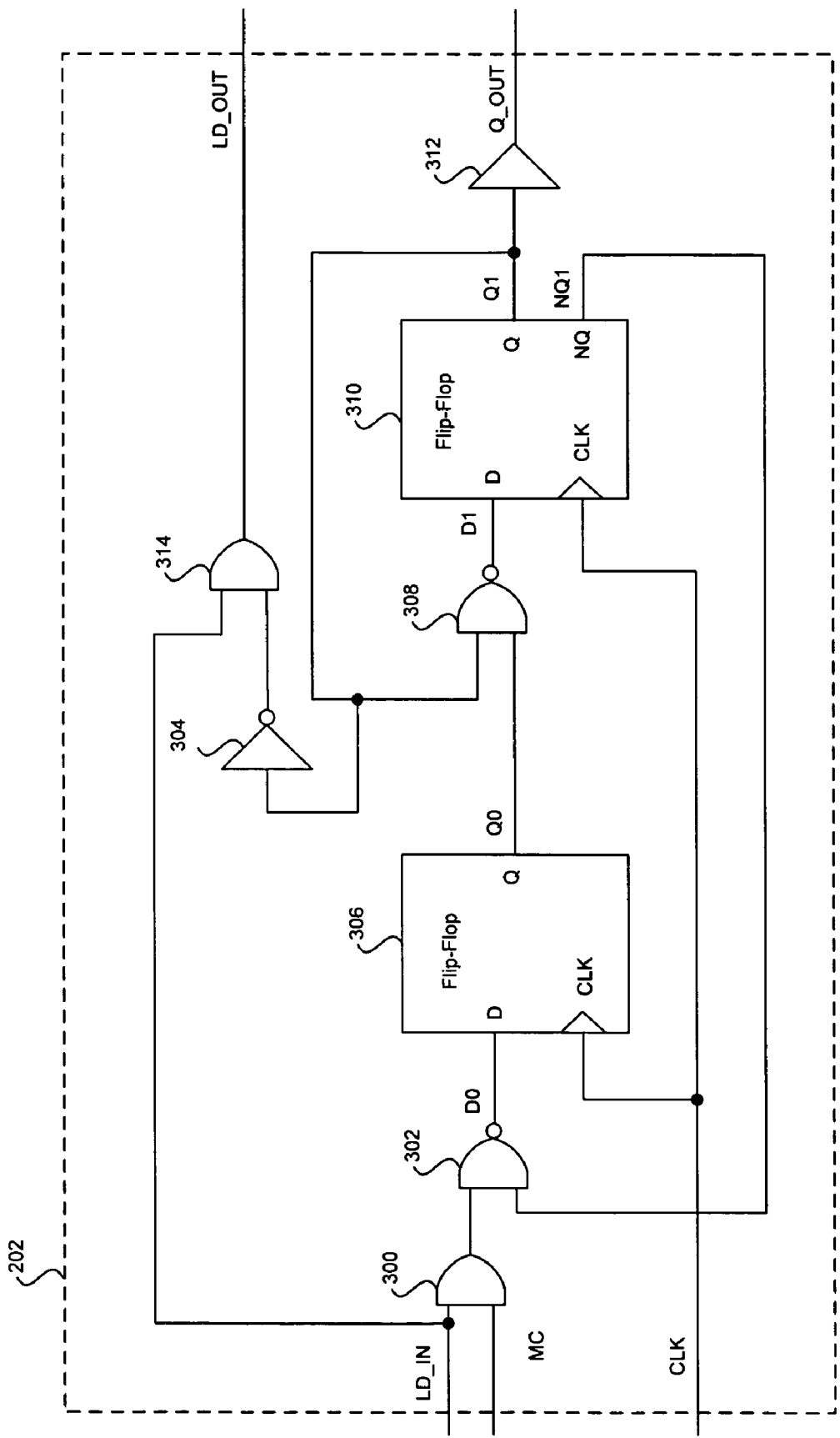
FIG. 3 is a block diagram illustrating exemplary divider module logic, in accordance with an embodiment of the invention.

FIG. 3 is a block diagram illustrating exemplary divider module logic, in accordance with an embodiment of the invention. Referring to FIG. 3, there is shown the divider module 202, which may comprise AND gates 300 and 314, NAND gates 302 and 308, an inverting buffer 304, flip-flops 306 and 310, and a non-inverting buffer 312. Additionally, there is shown inputs and outputs of the divider module 202, which may be the inputs MC, LD_IN, and CLK, and the outputs Q_OUT and LD_OUT.

In operation, an input signal, for example, Sig_In (FIG. 2a), may be received at the CLK input, and this signal may clock the flip-flops 306 and 310 so that the output signals of the flip-flops 306 and 310, Q0, Q1, and NQ1, may be synchronous to the input signal. The signal communicated to input LD_IN may be transferred to an input of each AND gate 300 and 314. The signal communicated to the input MC may be transferred to another input of the AND gate 300. The output of the AND gate 300 may be coupled to an input of the NAND gate 302. The NQ output of the flip-flop 310 may be coupled to another input of the NAND gate 302. The output of the NAND gate 302 may be coupled to a D input of the flip-flop 306.

Therefore, the feedback path propagation delay of the signal at the NQ output of the flip-flop 410, NQ1, may be the propagation delay of the NAND gate 302. The propagation delay of the NAND gate 302 may be less than the propagation delay through multiple gates, for example, AND gate 400 and NAND gate 402, as illustrated with respect to FIG. 4. Therefore, an embodiment of the invention that utilizes the divider module illustrated in FIG. 3 as the first stage divider module may be able to divide faster frequency signals than an embodiment of the invention that utilizes the divider module illustrated in FIG. 4 as the first stage divider module.

The signal at the D input of the flip-flop 306, D0, may be described by the Boolean equation:

$$D0 = NOT((MC) \text{ AND } (LD\_IN) \text{ AND } (NQ1)).$$

In the equation above, MC may represent the logic value, for example, logic zero or logic one, of the signal at the MC input, and LD_IN may represent the logic value of the signal at the LD_IN input. The Q output of the flip-flop 306 may be coupled to an input of the NAND gate 308. The Q output of the flip-flop 306 may be coupled to another input of the NAND gate 308. The output of the NAND gate 308 may be coupled to the D input of the flip-flop 310. The signal at the D input of the flip-flop 310, D1, may be described by the Boolean equation:

$$D1 = NOT((Q0) \text{ AND } (Q1)).$$

The Q output of the flip-flop 310 may be coupled to an input of the non-inverting buffer 312. The signal at the output of the non-inverting buffer 312 may be transferred to the Q_OUT output of the divider module 202. The Q output of the flip-flop 310 may also be coupled to an input of the inverting buffer 304. The output of the inverting buffer 304 may be coupled to another input of the AND gate 314. The signal at the output of the AND gate 314 may be transferred to the LD_OUT output. The signal at the LD_OUT output may be described by the Boolean expression:

LD_OUT=((LD_IN) AND (NOT(Q1))=((LD_IN) AND (NQ1)).

In the equation above, LD_OUT may represent the logic value of the signal at the LD_OUT output, and LD_IN may represent the logic value of the signal at the LD_IN input.

Although FIG. 3 may describe a specific implementation of the divider module 202, the invention need not be so limited. Accordingly, the functionality of the divider module 202 may be implemented in other ways by taking advantage of various Boolean equivalences. For example, the signal NQ1, which may be of the opposite value than the signal Q1, may be communicated to an inverting buffer, and the output of the inverting buffer may be the Q_OUT output. Additionally, if the divider module Divmod_1 is only used as a first stage divider module, then the inverting buffer 304 and the AND gate 314 may be removed since there will not be a preceding stage to which to communicate a load signal.

Figure 4:
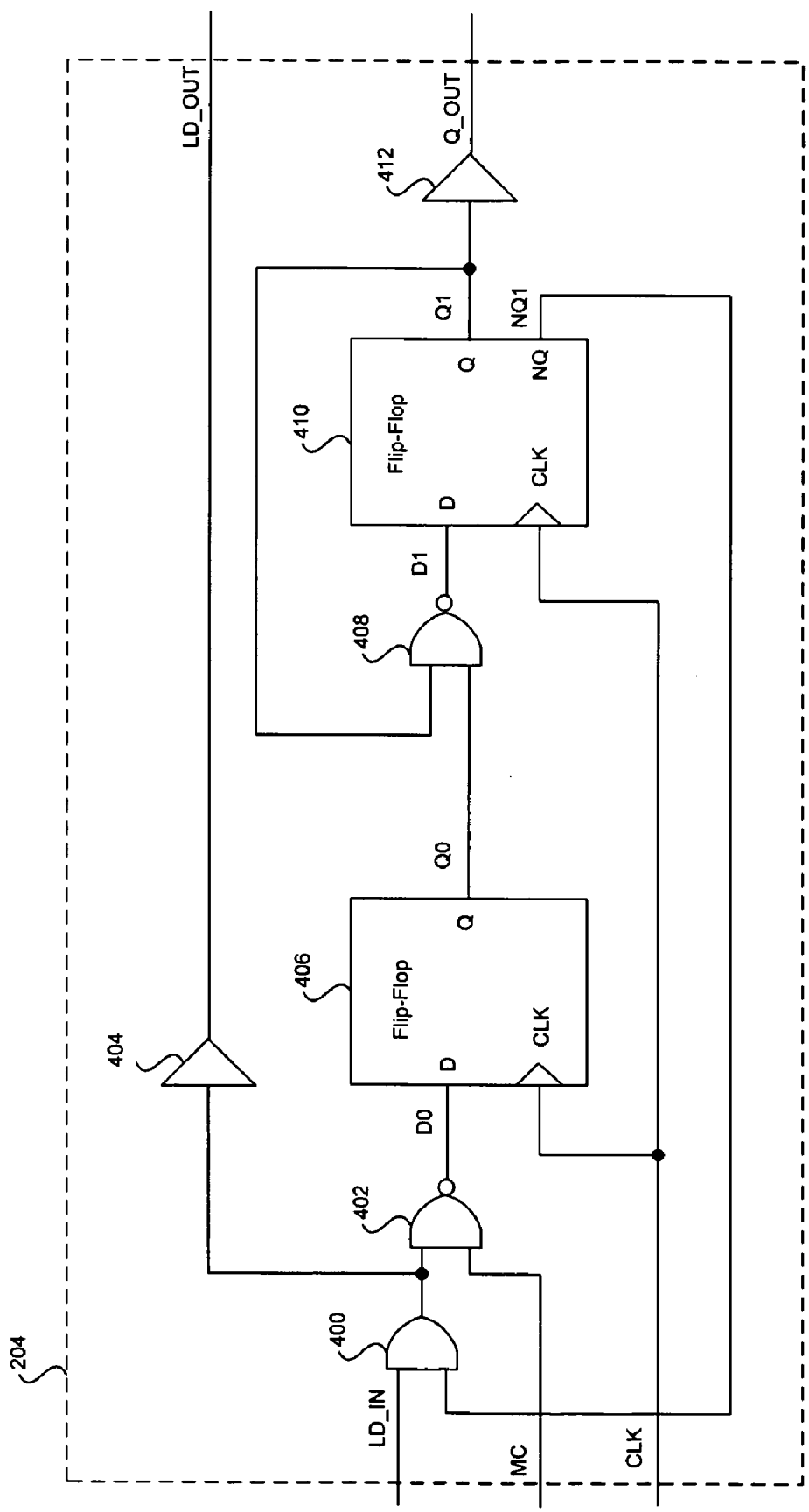
FIG. 4 is a block diagram illustrating alternate exemplary divider module logic, in accordance with an embodiment of the invention.

FIG. 4 is a block diagram illustrating alternate exemplary divider module logic, in accordance with an embodiment of the invention. Referring to FIG. 4, there is shown the divider module 204, which may comprise an AND gate 400, NAND gates 402 and 408, an inverting buffer 404, flip-flop 406 and 410, and a non-inverting buffer 412. Additionally, there is shown inputs and outputs of the divider module 204, which may be the inputs MC, LD_IN, and CLK, and the outputs Q_OUT and LD_OUT.

In operation, an input signal, for example, Sig_In (FIG. 2a), may be received at the CLK input, and this signal may be utilized to clock the flip-flops 406 and 410 so that the output of the flip-flops 406 and 410, Q0, Q1, and NQ1, may be synchronous to the input signal, Sig_In. The signal communicated to LD_IN input may be transferred to an input of the AND gate 400. The NQ output of the flip-flop 410 may be coupled to another input of the AND gate 400. The output of the AND gate 400 may be coupled to an input of the NAND gate 402 and to an input of the non-inverting buffer 404. The signal communicated to the MC input may be transferred to another input of the NAND gate 402. The output of the NAND gate 402 may be coupled to a D input of the flip-flop 406. The signal at the D input of the flip-flop 406, D0, may be described by the Boolean equation:

D0=NOT((MC) AND (LD_IN) AND (NQ1)).

In the equation above, MC may represent the logic value of the signal at the MC input, and LD_IN may represent the logic value of the signal at the LD_IN input. The Q output of the flip-flop 406 may be coupled to an input of the NAND gate 408. The Q output of the flip-flop 410 may be coupled to another input of the NAND gate 408. The output of the NAND gate 408 may be coupled to the D input of the flip-flop 410. The signal at the D input of the flip-flop 410, D1, may be described by the Boolean equation:

D1=NOT((Q0) AND (Q1)).

The Q output of the flip-flop 410, may also be coupled to an input of the non-inverting buffer 412. The signal at the output of the non-inverting buffer 412 may be transferred to the Q_OUT output of the divider module 202. The signal at the output of the non-inverting buffer 404 may be transferred to the LD_OUT output. The signal at the LD_OUT output may be described by the Boolean equation:

LD_OUT=((LD_IN) AND (NQ1)).

In the equation above, LD_OUT may represent the logic value of the signal at the LD_OUT output. Similarly, LD_IN may represent the logic value of the signal at the LD_IN input.

Although FIG. 4 may describe a specific implementation of the divider module 204, the invention need not be so limited. The functionality of the divider module 204 may be implemented in other ways by taking advantage of various Boolean equivalences. For example, the signal NQ1, which may be of opposite logic value than the signal Q1, may be communicated to an inverting buffer, and the output of the inverting buffer may be the Q_OUT output.

FIG. 5a is an exemplary state table illustrating states of the divider module logic of FIG. 3, in accordance with an embodiment of the invention. An embodiment of the divider module logic 202, as described in FIG. 3, may be associated with a state table of FIG. 5a. The state table of FIG. 5a has 16 states, and therefore may be represented by 4 bits from 0000 to 1111. The most significant state bit may be the control input signal at the MC input. The next most significant state bit may be the signal at the LD_IN input. In this description of FIG. 5a, the outputs MC and LD_IN may also refer to the signals at those outputs. The least two significant state bits may be the signals at the Q outputs of the flip-flops 306 and 310 (FIG. 3), Q0 and Q1, respectively. The output of the flip-flop 310, Q1, may be the least significant bit.

Referring to FIG. 5a, in the states 0000 to 0011, MC and LD_IN may be logic zero, and the present Q0 and Q1 may also be logic zeros. In state 0000, the present Q0 and Q1 may be logic zeros. Therefore, utilizing the Boolean expressions for D0 and D1 from FIG. 3, D0 and D1 may be calculated to be logic ones. The next Q0 and Q1, for example, for the next state, may be logic ones when the flip-flops are clocked to the next state by the input signal received by the CLK inputs of the flip-flops. In state 0001, the present Q0 and Q1 may be logic zero and logic one, respectively. This may lead to logic ones for D0 and D1, and therefore, the next Q0 and Q1 may be logic ones. In state 0010, the present Q0 and Q1 may be logic zero and logic one, respectively. This may lead to D0 and D1 being logic ones, and therefore, to the next Q0 and Q1 of the next state being logic ones. In state 0011, the logic values for the present Q0 and Q1 may be logic ones. This may lead to D0 and D1 being logic one and logic zero, respectively. Therefore, the next Q0 and Q1 may be logic one and logic zero, respectively.

The states 0100 to 0111 and 1000 to 1011 may have the same logic values for D0 and D1 and for the next Q0 and Q1 as the states 0000 to 0011. However, the states 1100 to 1111 may be different. In state 1100, the present Q0 and Q1 may be logic zeros. Therefore, utilizing the Boolean expressions for D0 and D1 from FIG. 3, D0 and D1 may be logic zero and logic one, respectively. Hence, the next Q0 and Q1 may be logic zero and logic one, respectively, when the flip-flops are clocked to the next state by the input signal received at the CLK inputs of the flip-flops. In state 1101, the present Q0 and Q1 may be logic zero and logic one, respectively. D0 and D1 may then be logic ones, and therefore, the next Q0 and Q1 may be logic ones. In state 1110, the present Q0 and Q1 may be logic one and logic zero, respectively. This may lead to D0 and D1 being logic zero and logic one, respectively, and, therefore, the next Q0 and Q1 may be logic zero and logic one, respectively, at the next state. In state 1111, the present Q0 and Q1 may be logic ones. This may lead to D0 and D1 values of logic one and logic zero, respectively. Therefore, the next Q0 and Q1 may be logic one and logic zero, respectively.

In utilizing the state table, a starting state may be chosen, and then the next Q0 and Q1 values may be looked up. Appending the Q0 and Q1 values to the values of MC and LD_IN may determine the next state. The next step may be to go to the next state determined, and similarly look up the next Q0 and Q1 values listed. For example, state 0000 may be chosen as the starting state. The next Q0 and Q1 may be logic ones. Therefore, if the values of MC and LD_IN remain the same, the next state may be determined to be 0011. Looking at state 0011, the next Q0 and Q1 may be logic one and logic zero. Therefore, the next state may be determined to be 0010. The next state after the state 0010 may be 0011.

If the present state is 0010, as above, but the logic values of MC and LD_IN change to logic ones, the new present state may be 1110. The next state after state 1110 may then be 1101. At initial power-up, a divider module may start in state 0000. However, after the initial power-up, the divider module may not output logic zeros for the next Q0 and Q1. Therefore, it can be seen that the divider module may be in either state 0010 or 0011. This may be utilized to generate an output signal that may be one-half the frequency of the input signal. The states 0100 to 0111 and 1100 to 1111 may be the same with respect to the next Q0 and Q1.

If, after the initial power-up period, MC is logic one, and LD_IN is logic one for two clock periods, and the present state is 1111, the next two states may be 1110 and 1101. The state 1101 may show that the next Q0 and Q1 are logic ones. Since two clock periods may have elapsed, LD_IN may change to logic zero. Therefore, the next state may be 1011. It was described above that states whose first two bits are not "11" may alternate between states whose Q0 and Q1 logic values are "11" and "10." Hence, the LD_IN signal may allow a divide by three once, and then divide by two continuously after that. However, if, after the initial power-up period, MC and LD_IN is logic one, then the states may transition from 1111 to 1110 to 1101, and back to state 1111. Therefore, this may be utilized to divide by three continuously. The continuous logic one value of the LD_IN signal may be forcing the state transitions to continuously divide by three, rather than divide by three once and then by twos.

If the MC and/or LD_IN change in logic values, determining the next state may utilize the new logic values of MC and/or LD_IN, along with the next values for Q0 and Q1. For example, if the present state is 0011, and MC and LD_IN will be logic ones for the next state, the next state may be determined to be 1110. From that state, the next state may be determined to be 1101, and the state after that may be 1111, if MC and LD_IN do not change. Therefore, the MC logic value may be set to logic zero to divide by two continuously. In addition to affecting the state transitions, changes in the logic values for LD_IN may also affect LD_OUT. For example, from the state table, LD_OUT may be logic one in states 0100, 0110, 1100 and 1110. However, since states 0100 and 1100 may not be entered after the initial power-up period, LD_OUT may be generated during states 0110 and 1110.

Figure 5B:
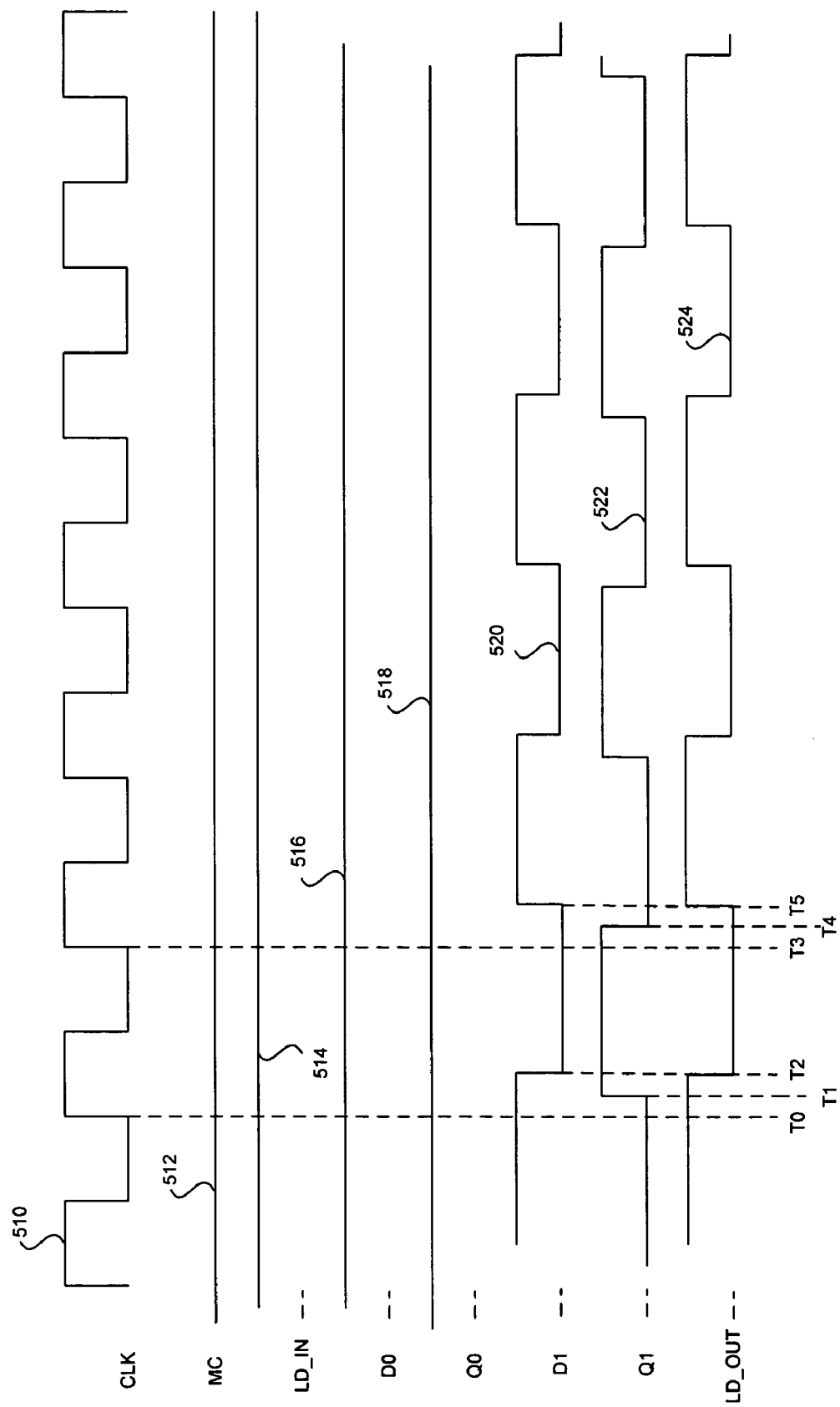
FIG. 5b is a timing diagram of exemplary signals utilized during frequency division by a last stage divider module of FIG. 3 when the control input signal is logic zero, in accordance with an embodiment of the invention.

FIG. 5b is a timing diagram of exemplary signals utilized in frequency division by a last stage divider module of FIG. 3 when the control input signal is logic zero, in accordance with an embodiment of the invention. Referring to FIG. 5b, there is shown a plurality of signals, an input signal, CLK 510, the control input signal, MC 512, the input load signal, LD_IN 514, the first flip-flop input signal, D0 516, the first flip-flop output signal, Q0 518, the second flip-flop input signal, D1 520, the second flip-flop output signal, Q1 522, and the output load signal, LD_OUT 524. The signals CLK 510, MC 512, LD_IN 514, and LD_OUT 524 may be signals at the inputs and output of a divider module, for example, the divider module 202 (FIG. 2a).

In operation, the control input signal, MC 512, may be logic zero, and the input load signal, LD_IN 514, may be logic one. The present Q0 and Q1 may be logic one and logic zero, respectively. The present state may then be state 0110. Therefore, utilizing the state diagram in FIG. 5a, the input signals for the flip-flops, D0 516 and D1 520, may both be logic ones. Hence, the rising edge of the input signal, CLK 510, at time T0 may lead the flip-flop output signals, Q0 518 and Q1 522, to be logic ones at time T1. The new state may be 0111. At time T2, the change to the state 0111 may lead to changes in logic values of the second flip-flop input signal, D1 520, and the output load signal, LD_OUT 524. The LD_OUT signal may be communicated to the previous stage divider module. For example, if the current stage divider module is the divider module 204 (FIG. 2a), LD_OUT may be communicated to the divider module 202.

Similarly, at time T3, the rising edge of the input signal, CLK 510, may lead to the falling edge, at time T4, of the second flip-flop output signal, Q1 522. The new state may be 0111. At time T5, the change in the logic value of the second flip-flop output signal, Q1 522, may lead to changes in logic values of the second flip-flop input signal, D1 520, and the output load signal, LD_OUT 524. The frequency of the output of the second flip-flop, Q1 522, may be one-half of the frequency of the input signal, CLK 510.

Figure 5C:
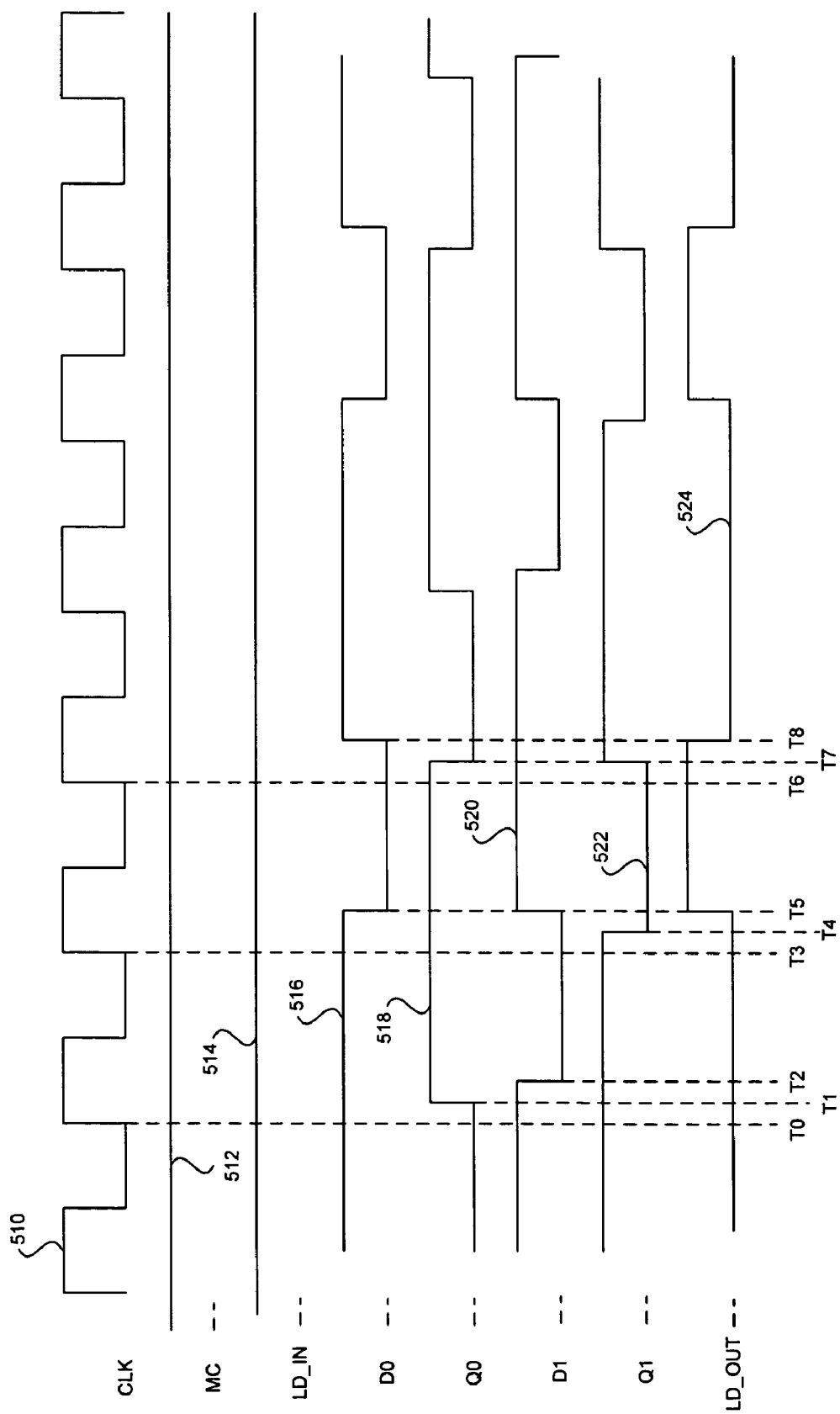
FIG. 5c is a timing diagram of exemplary signals utilized during frequency division by a last stage divider module of FIG. 3 when the control input signal is logic one, in accordance with an embodiment of the invention.

FIG. 5c is a timing diagram of exemplary signals utilized in frequency division by a last stage divider module of FIG. 3 when the control input signal is logic one, in accordance with an embodiment of the invention. Referring to FIG. 5c, there is shown a plurality of signals, an input signal, CLK 510, the control input signal, MC 512, the input load signal, LD_IN 514, the first flip-flop input signal, D0 516, the first flip-flop output signal, Q1 518, the second flip-flop input signal, D1 520, the second flip-flop output signal, Q1 522, and the output load signal, LD_OUT 524. The signals CLK 510, MC 512, LD_IN 514, and LD_OUT 524 may be signals at the inputs and output of a divider module, for example, the divider module 202 (FIG. 2a).

In operation, the control input signal, MC 512, and the input load signal, LD_IN 514, may be logic ones. The present Q0 and Q1 may be logic zero and logic one, respectively. Therefore, the present state may be 1101. The state table of FIG. 5a may indicate that the input signals to the flip-flops, D0 516 and D1 520, may be logic ones. Therefore, the rising edge of the input signal, CLK 510, at time T0 may lead to logic ones for the output signals, Q0 518 and Q1 522, at time T1. This may lead to a change to the input to the first flip-flop, D0 516, to logic zero at time T3.

For this new state 1111, the state table of FIG. 5a may indicate that the input signals to the flip-flops, D0 516 and D1 520, may be logic one and logic zero, respectively. Therefore, the rising edge of the input signal, CLK 510, at time T3 may lead to logic one and logic zero for the output signals, Q0 518 and Q1 522, respectively, at time T4. This may lead to a change to the inputs to the first and second flip-flops, D0 516 and D1 520, at time T5. At time T5, the output load signal, LD_OUT 524, may be asserted, and this signal from this last stage divider module may indicate that the output may have been divided by the integer divide factor, and therefore, a new count may need to start. The new state may now be 1110.

For the state 1110, the state table of FIG. 5a may indicate that the input signals to the flip-flops, D0 516 and D1 520, may be logic zero and logic one, respectively. Therefore, the rising edge of the input signal, CLK 510, at time T6 may lead to logic zero and logic one for the output signals, Q0 518 and Q1 522, respectively, at time T7. This may lead to a change to the inputs to the first and second flip-flops, D0 516 and D1 520, at time T8. At time T8, the output load signal, LD_OUT 524, may also be asserted. The output signal of the second flip-flop, Q1 522, may have one-third the frequency of the input signal, CLK 510. The new state may be 1101.

Figure 5D:
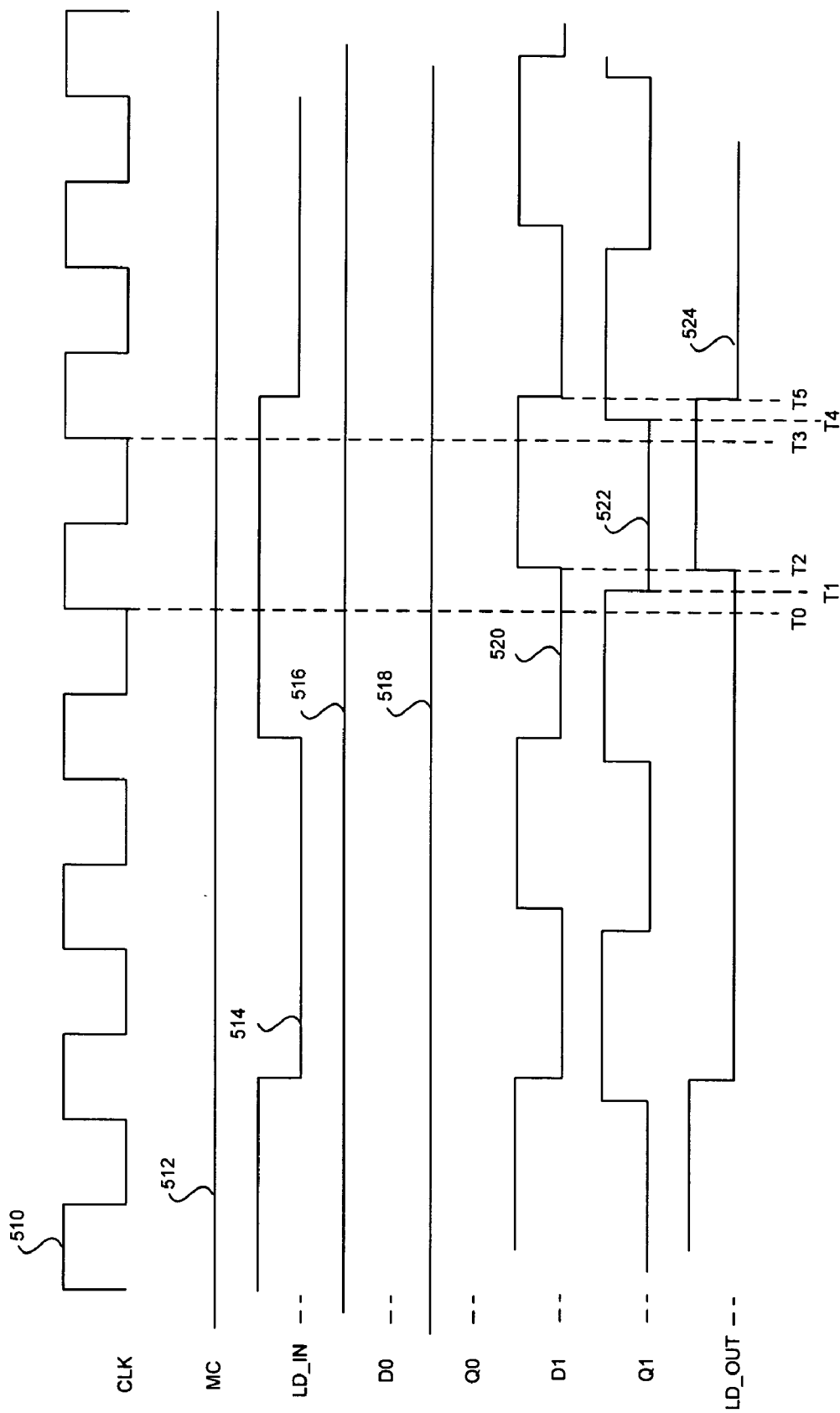
FIG. 5d is a timing diagram of exemplary signals utilized during frequency division by a non-last stage divider module of FIG. 3 when the control input signal is logic zero, in accordance with an embodiment of the invention.

FIG. 5d is a timing diagram of exemplary signals utilized in frequency division by a non-last stage divider module of FIG. 3 when the control input signal is logic zero, in accordance with an embodiment of the invention. Referring to FIG. 5d, there is shown a plurality of signals, an input signal, CLK 510, the control input signal, MC 512, the input load signal, LD_IN 514, the first flip-flop input signal, D0 516, the first flip-flop output signal, Q0 518, the second flip-flop input signal, D1 520, the second flip-flop output signal, Q1 522, and the output load signal, LD_OUT 524. The signals CLK 510, MC 512, LD_IN 514, and LD_OUT 524 may be signals at the inputs and output of a divider module, for example, the divider module 202 (FIG. 2a).

In operation, the control input signal, MC 512, may be logic zero, and the input load signal, LD_IN 514, may be communicated from a subsequent stage divider module. For example, if the current stage divider module is the divider module 202, the input load signal, LD_IN 514, may be from the divider module 204 (FIG. 2a). The present values of the input load signal, LD_IN 514, and the output signals, Q0 and Q1, of the flip-flops prior to time T0 may be logic ones. Therefore, the present state may be 0111. The state table of FIG. 5a may indicate that the input signals to the flip-flops, D0 516 and D1 520, may be logic one and logic zero, respectively. Therefore, the rising edge of the input signal, CLK 510, at time T0, may lead to logic one and logic zero for the flip-flop output signals, Q0 518 and Q1 522, respectively, at time T1. This may lead to a change to the input to the second flip-flop, D1 516, to logic one at time T2. At time T2, the output load signal, LD_OUT 524, may also be asserted. The present state may now be state 0110.

For the new state 0110, the state table of FIG. 5a may indicate that the input signals to the flip-flops, D0 516 and D1 520, may be logic one. Therefore, the rising edge of the input signal, CLK 510, at time T3 may lead to logic ones for the flip-flop output signals, Q0 518 and Q1 522, at time T4. This may lead to a change to the inputs to the first and second flip-flops, D0 516 and D1 520, at time T5. The output load signal, LD_OUT 524, may be deasserted at Time T5. The new state may now be 0111. The output signal of the second flip-flop, Q1 522, may have one-half the frequency of the input signal, CLK 510.

Figure 5E:
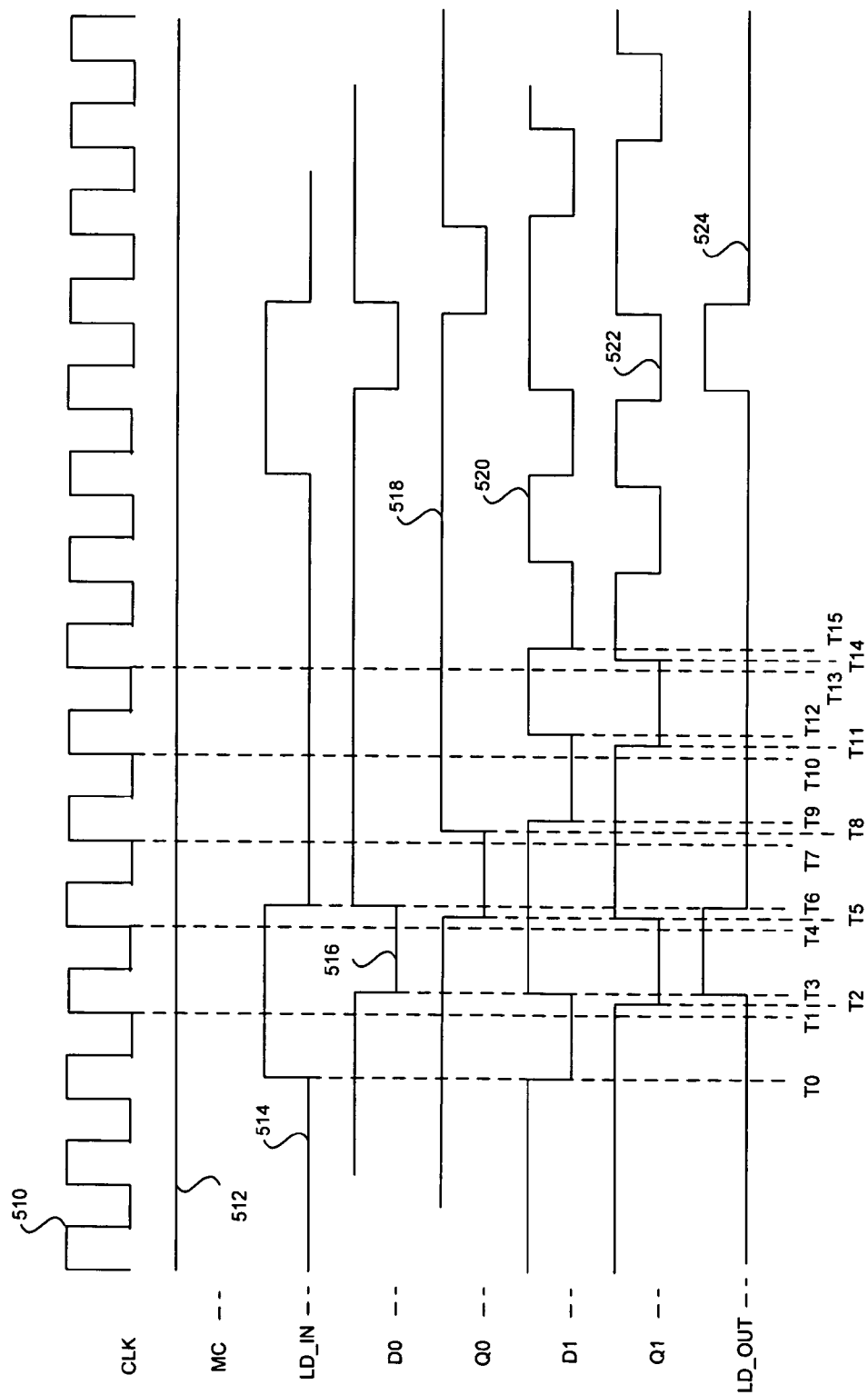
FIG. 5e is a timing diagram of exemplary signals utilized during frequency division by a non-last stage divider module of FIG. 3 when the control input signal is logic one, in accordance with an embodiment of the invention.

FIG. 5e is a timing diagram of exemplary signals utilized in frequency division by a non-last stage divider module of FIG. 3 when the control input signal is logic one, in accordance with an embodiment of the invention. Referring to FIG. 5e, there is shown a plurality of signals, an input signal, CLK 510, the control input signal, MC 512, the input load signal, LD_IN 514, the first flip-flop input signal, D0 516, the first flip-flop output signal, Q0 518, the second flip-flop input signal, D1 520, the second flip-flop output signal, Q1 522, and the output load signal, LD_OUT 524. The signals CLK 510, MC 512, LD_IN 514, and LD_OUT 524 may be signals at the inputs and output of a divider module, for example, the divider module 202 (FIG. 2a).

In operation, at a time instant just prior to T0, the control input signal, MC 512, may be logic one and the input load signal, LD_IN 514, may be logic zero. The input load signal, LD_IN 514, may be communicated from a subsequent stage divider module. For example, if a current stage divider module is the divider module 202, the input load signal, LD_IN 514, may be from the divider module 204 (FIG. 2a). The present output signals of the flip-flops, Q0 518 and Q1 522, may be logic ones. Therefore, the state just prior to time T0 may be 1011. At time T0, the input load signal, LD_IN 514, may be asserted. Therefore, the state at time T0 may be 1111. The state table of FIG. 5a may indicate that the input signals to the flip-flops, D0 516 and D1 520, may be logic one and logic zero, respectively. Therefore, the rising edge of the input signal, CLK 510, at time T1, may lead to logic one and logic zero for the flip-flop output signals, Q0 518 and Q1 522, respectively, at time T2. At time T2, the output load signal, LD_OUT 524, may be asserted. The present state may now be state 1110. The input signals to the flip-flops, D0 516 and D1 520, may be logic zero and logic one, respectively, at time T3.

At time T4, the rising edge of the input signal, CLK 510, may lead to state 1101 at time T5. At time T6, the input load signal, LD_IN 514, may be deasserted, and, therefore, the output load signal, LD_OUT 524, may be deasserted. The state may now be state 1001. This may lead to changes to the input signals to the flip-flop, D0 516 and D1 520, to logic ones. The rising edge of the input signal, CLK 510, at time T7 may lead to the state 1011 at time T8 and, at time T9, to a change to logic zero for the second flip-flop input signal, D1 520. At time T10, the rising edge of the input signal, CLK 510, may lead to the state 1010 at time T11 and, at time T12, to a change to logic one for the second flip-flop input signal, D1 520. The rising edge of the input signal, CLK 510, at time T13 may lead to the state 1011 at time T14 and, at time T15, to a change to logic zero for the second flip-flop input signal, D1 520.

Therefore, a current stage divider module with the control input signal, MC 512, at logic one may divide by three once after an input load signal, LD_IN 514, is asserted. After the input load signal, LD_IN 514, is deasserted, the divider module may divide by twos. Although the timing diagram may show the input load signal, LD_IN 514, as two periods of the input signal, CLK 510, the invention need not be so limited. For example, another embodiment of the invention may generate an input load signal, LD_IN 514, which is asserted for only one period of the input signal, CLK 510.

Figure 6:
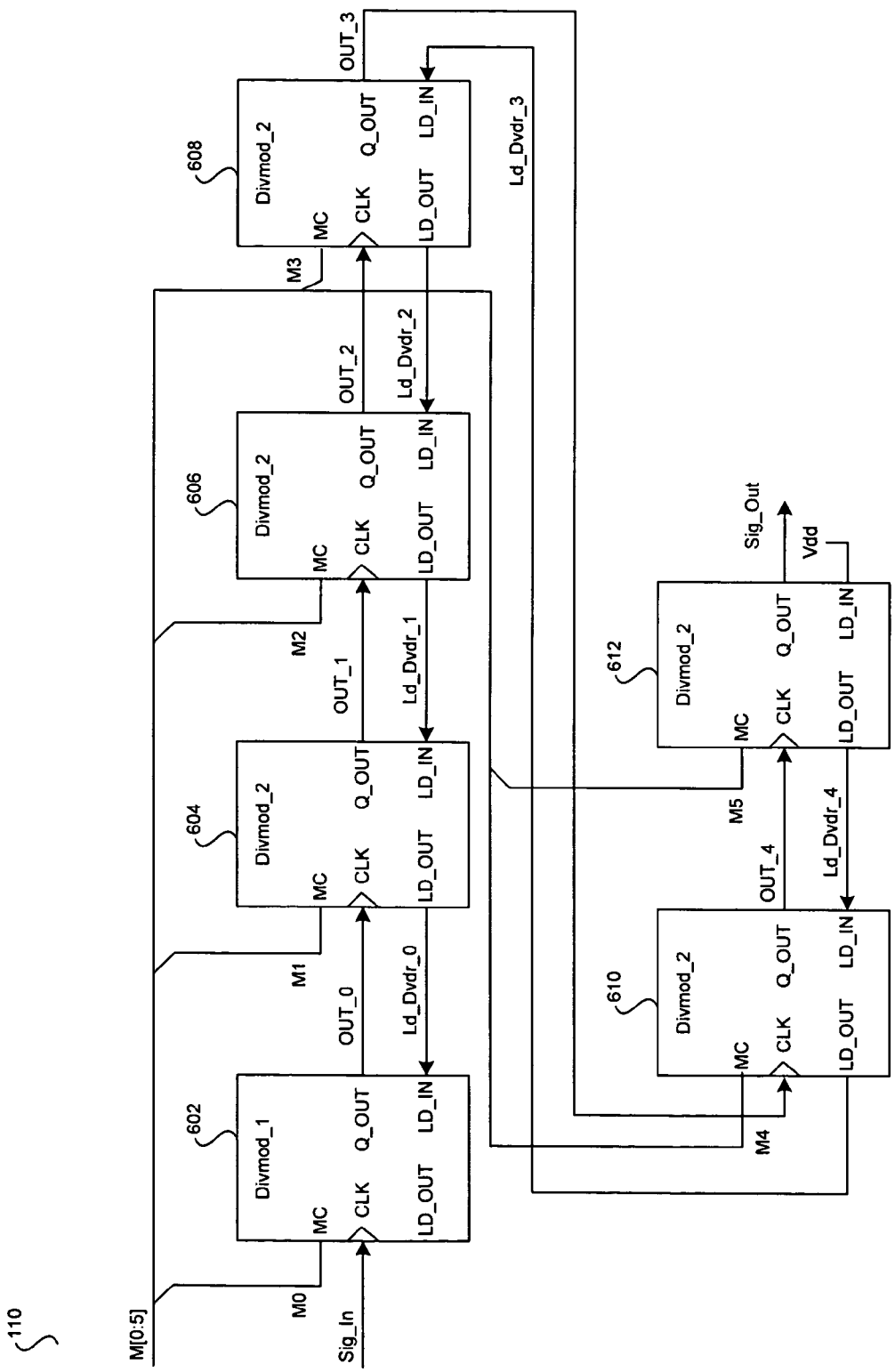
FIG. 6 is a block diagram illustrating an exemplary frequency division circuit capable of dividing an input signal frequency by an integer from 64 to 127, inclusive, in accordance with an embodiment of the invention.

FIG. 6 is a block diagram illustrating an exemplary frequency division circuit capable of dividing an input signal frequency by an integer from 64 to 127, inclusive, in accordance with an embodiment of the invention. Referring to FIG. 6, there is shown six divider modules 602, 604, 606, 608, 610, and 612. The divider module 602 may be of the type Divmod_1 and the remaining divider modules 604, 606, 608, 610, and 612 may be of the type Divmod_2. The divider modules may be similar to the divider modules described with respect to FIGS. 2a, 3 and 4, and may be coupled together in a similar manner. The divider module types Divmod_1 and Divmod_2 may be similar to the divider modules described with respect to FIG. 3 and FIG. 4, respectively. Accordingly, divider module 602, which may be of the type Divmod_1, may be able to divide faster frequency signals than the divider modules 604, 606, 608, 610 and 612, which may be of the type Divmod_2.

In operation, the control input signals M[0:5] may be related to a desired integer divide factor by which to divide an input signal. Each of the divider modules may receive one of the control input signals M0 to M5. The first stage divider module, the divider module 602, may receive the control input signal M0, and the last stage divider module 612 may receive the control input signal M5. In this manner, each of the divider modules may receive an input signal and divide it accordingly. The divider module 602 may receive the input signal, Sig_In, and generate an output signal, Out_0, that may be communicated to the CLK input of the second stage divider module 604. Each divider module may output a signal that may be communicated to the CLK input of the subsequent stage divider module. The output signal, Sig_Out, of the last stage divider module 612 may be a signal that has been divided by the desired integer divide factor represented by the control input signals M[0:5]. Since FIG. 6 illustrates six stages of divider modules, the input signal may be divided by any integer from 64 to 127, as described in FIG. 2a.

Figure 7:
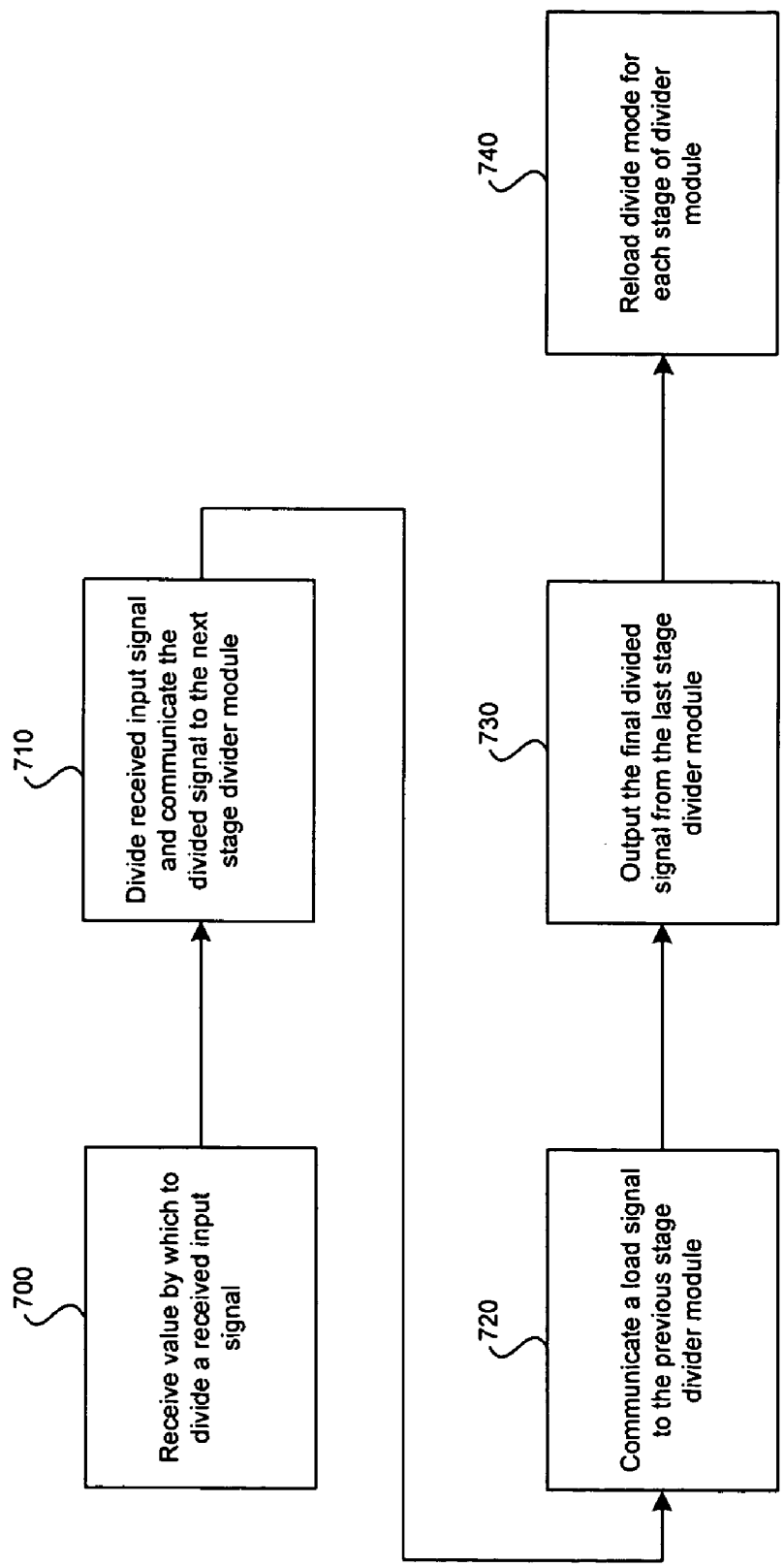
FIG. 7 illustrates an exemplary flow diagram illustrating dividing the frequency of an input signal, in accordance with an embodiment of the invention.

FIG. 7 illustrates an exemplary flow diagram illustrating dividing the frequency of an input signal, in accordance with an embodiment of the invention. Referring to FIG. 7, step 700 comprises receiving control input signals that may indicate the factor to divide a frequency of a received input signal. Step 710 may comprise each stage of divider module dividing the received input signal according and communicating the divided signal to a subsequent stage divider module. Step 720 may comprise generating a load signal at a current stage divider module to communicate to a previous stage divider module. Step 730 may comprise the last stage divider module generating an output signal, whose frequency may have been divided appropriately with respect to the input signal received by the first stage divider module. Step 740 may comprise an output load signal that may be communicated to the previous stage divider module. In this manner, all stages of divider modules before the last stage may reload to divide again.

Referring to FIGS. 1, 2a–e, 3, 4, 5a, 6 and 7, the steps 700 to 740 may be utilized to divide the frequency of an input signal by an integer factor within a range supported by the number of stages of divider modules. In step 700, the divider modules that may be part of a frequency divider, for example, the frequency divider 110, may receive control input signals, for example, from the register 130. The control input signals may indicate to the divider modules the correct number by which to divide a frequency of an input signal. As illustrated in FIGS. 2a–e and FIG. 5a, each divider module, except the last stage divider module, may divide continuously by two, or once by three and then continuously by two. The last stage divider module may divide by two or three since the load input, LD_IN, may be coupled to Vdd. Therefore, whether the last stage divider module, for example, the divider module 612, divides by two or three may depend on the control input signal it receives.

In step 710, each divider module may divide the received input signal appropriately as indicated by the control input signal. The divided signal may be communicated to the subsequent stage divider module. The last stage divider module may output the divided signal as the final result and this divided signal may have a frequency that is reduced by a factor indicated by the control input signals than the input signal to the first stage divider module. The first stage divider module, for example, the divider module 602, may receive an input signal that has the fastest frequency since all subsequent divider modules may receive signals that may have been divided with respect to the input signal to the divider module 602. Therefore, the first stage divider module may need to be able to handle faster frequencies than the subsequent divider modules. Accordingly, the first stage divider module may be the divider module described with respect to FIG. 3, in which feedback path propagation delay may be less than the feedback path propagation delay of the divider module described with respect to FIG. 4.

In step 720, each divider module may generate an output load signal after each appropriate division. The output load signal may be communicated to a load input of the previous stage divider module. The received output load signal may be utilized by the previous stage divider module to set the divide logic, which may be a state machine, so that the previous divider module may divide by twos continuously, or divide by three once, and then by twos continuously. If the previous stage divider module divides by twos only, then the received output load signal from the subsequent stage divider module may not have any effect on the previous stage divider module's divide logic.

Each divider module, except for the first stage divider module and the last stage divider module, may logical AND the received output load signal from the subsequent stage divider module with a locally generated signal as the output load signal to communicate to a previous divider module. The first divider module may not have a previous stage divider module to which it can send the output load signal. Therefore, a first stage divider module may not need to generate the output load signal. Alternatively, it may generate an output load signal, but the output load signal may not be communicated to another divider module. The last stage divider module may not have a subsequent stage divider module from which to receive a load signal. Therefore, the last stage divider module may have the load input, LD_IN, coupled to Vdd, or to another similar voltage supply whose voltage level may be logic one. The last stage divider module may then divide by twos if the control input signal is logic zero, or by threes if the control input signal is logic one.

In step 730, the last stage divider module, for example, the divider module 612, may output a signal, Sig_Out, whose frequency may be appropriately divided with respect to the input signal, for example, Sig_In, to the first stage divider module, for example, the divider module 602.

In step 740, the last stage divider module 612 may communicate an output load signal to the previous stage divider module 610, and that divider module may utilize that received output load signal to set its divide logic as needed. The divider module 610 may also utilize the received output load signal to generate its own output load signal, and that output load signal may be communicated to its previous stage divider module. This process of generating output load signals and communicating it to the previous stage divider module may continue until the first stage divider module, for example, the divider module 602, receives the output load signal from the subsequent stage divider module. The first stage divider module may utilize the received output load signal to set its divide logic, but may not communicate its generated output load signal since there may not be a previous stage divider module. Alternatively, the first stage divider module may not include circuitry that may generate and/or communicate the output load signal to the previous stage divider module, since there is no previous stage divider module.

Although timing diagrams with respect to FIGS. 2b–e and FIGS. 5b–e may show multiple signals transitioning from one state to the other at the same time, the invention need not be limited in this manner. For illustration purposes, exact timing was not used. Accordingly, one signal may transition before another although both may have been described as transitioning at the same time. Additionally, although the rising edge of signals may have been used in the descriptions of the various figures, the invention need not be so limited. An embodiment of the invention may also utilize falling edges of signals, although appropriate changes may need to be made with respect to the logic described.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for dividing a frequency of a signal, the method comprising:
   generating a divided signal from an output portion of a divider module for a current stage;
   feeding back said divided signal to an input portion of said divider module in said current stage via a reduced feedback delay path; and
   if said input portion of said divider module in said current stage is coupled to said divider module in a previous stage, communicating a first load signal from said divider module in said current stage to said divider module in said previous stage, further comprising, if said divider module in said current stage is not coupled to said divider module in a subsequent stage, coupling an input port of said divider module that receives a second load signal to a high voltage potential of a voltage supply, wherein said high voltage potential indicates a value of logic one.

2. The method according to claim 1, comprising, if said divider module in said current stage is coupled to said divider module in said previous stage, receiving said divided signal from said divider module in said previous stage.

3. The method according to claim 1, comprising, if said divider module in said current stage is coupled to said divider module in a subsequent stage, communicating said divided signal to said divider module in said subsequent stage.

4. The method according to claim 1, comprising utilizing a received second load signal to generate said first load signal.

5. The method according to claim 1, comprising dividing an input signal by a factor of two to generate said divided signal.

6. The method according to claim 1, comprising utilizing a divide cycle to divide an input signal, wherein said input signal is divided by a factor of three once and then subsequently by a factor of two to generate said divided signal.

7. The method according to claim 1, comprising utilizing a received second load signal to initiate a new divide cycle.

8. The method according to claim 1, comprising receiving a control input signal that indicates a divide cycle that is utilized by said divider module in dividing an input signal.

9. The method according to claim 1, comprising coupling N stages of said divider modules, wherein an input signal is divided by any integer from $2^N$ to $((2^{N+1})-1)$, inclusive.

10. A system for dividing a frequency of a signal, the system comprising:
    a multistage divider that comprises:
       a divider module for a current stage that generates a divided signal from an output portion of said divider module;
       a reduced feedback delay path that is utilized to feed back said divided signal to an input portion of said divider module in said current stage; and
       circuitry that communicates a first load signal from said divider module in said current stage to said divider module in a previous stage, if said input portion of said divider module in said current stage is coupled to said divider module in said previous stage, wherein an input port of said divider module that receives a second load signal is coupled to a high voltage potential, of a voltage supply, that indicates logic one, if said divider module in said current stage is not coupled to said divider module in a subsequent stage.

11. The system according to claim 10, comprising circuitry that receives said divided signal from said divider module in said previous stage, if said divider module in said current stage is coupled to said divider module in said previous stage.

12. The system according to claim 10, comprising circuitry that communicates said divided signal to said divider module in said subsequent stage, if said divider module in said current stage is coupled to said divider module in a subsequent stage.

13. The system according to claim 10, comprising circuitry that generates said first load signal utilizing a received second load signal.

14. The system according to claim 10, wherein said divider module divides an input signal by a factor of two to generate said divided signal.

15. The system according to claim 10, wherein said divider module generates said divided signal utilizing a divide cycle to divide an input signal by a factor of three once and then subsequently by a factor of two.

16. The system according to claim 10, comprising circuitry that utilizes a received second load signal to initiate a new divide cycle.

17. The system according to claim 10, comprising circuitry that receives a control input signal that indicates a divide cycle that is utilized by said divider module to divide an input signal.

18. The system according to claim 10, comprising N stages of said divider modules coupled in said multistage divider, wherein an input signal to said multistage divider is divided by any integer from $2^N$ to $((2^{N+1})-1)$, inclusive.

* * * * *